US012688804B2

(12) United States Patent
Cha et al.

(10) Patent No.: US 12,688,804 B2
(45) Date of Patent: Jul. 21, 2026

(54) TEST SYSTEM, METHOD OF TESTING DISPLAY CELL USING THE SAME, AND DISPLAY DEVICE

(71) Applicant: Samsung Display Co., Ltd., Yongin-Si (KR)

(72) Inventors: Go Eun Cha, Suwon-si (KR); Il Nam Kim, Hwaseong-si (KR); Seung Hyun Moon, Suwon-si (KR); Dong Wook Yang, Suwon-si (KR); Hyun Dae Lee, Hwaseong-si (KR); Kang Bin Jo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 18/086,659

(22) Filed: Dec. 22, 2022

(65) Prior Publication Data

US 2023/0316966 A1     Oct. 5, 2023

(30) Foreign Application Priority Data

Mar. 29, 2022    (KR) ........................ 10-2022-0038707

(51) Int. Cl.
    *G09G 3/00*       (2006.01)
    *G01R 31/28*     (2006.01)
    *G06V 40/13*     (2022.01)

(52) U.S. Cl.
    CPC ......... *G09G 3/006* (2013.01); *G01R 31/2879* (2013.01); *G06V 40/13* (2022.01); *G09G 2300/0426* (2013.01); *G09G 2300/0439*
(2013.01); *G09G 2300/0809* (2013.01); *G09G 2310/0264* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 2019/0013368 A1 | 1/2019 | Chung et al. | |
| 2019/0180667 A1* | 6/2019 | Lin | ........................ G09G 3/20 |
| 2020/0035136 A1* | 1/2020 | Cho | ................... G01R 31/2635 |
| 2021/0132715 A1* | 5/2021 | Shin | .................... G06F 3/04164 |
| 2023/0015777 A1* | 1/2023 | Chang | ..................... H04M 1/22 |

FOREIGN PATENT DOCUMENTS

| | | |
|---|---|---|
| KR | 2019-0015688 A | 2/2019 |
| KR | 2021-0064483 A | 6/2021 |

* cited by examiner

*Primary Examiner* — Andre L Matthews
(74) *Attorney, Agent, or Firm* — Innovation Counsel LLP

(57) ABSTRACT

A test system, a method of testing a display cell using the same, and a display device are provided. There is provided a test system comprising: a display cell including a pixel and a data line connected to the pixel, an optical sensor and a readout line connected to the optical sensor, and a signal selection unit for selectively connecting a test signal line to any one of the data line and the readout line; and a test member configured to apply a first test control signal to the signal selection unit in a data test mode and apply a second test control signal to the signal selection unit in a sensing test mode.

19 Claims, 20 Drawing Sheets

FIG. 2
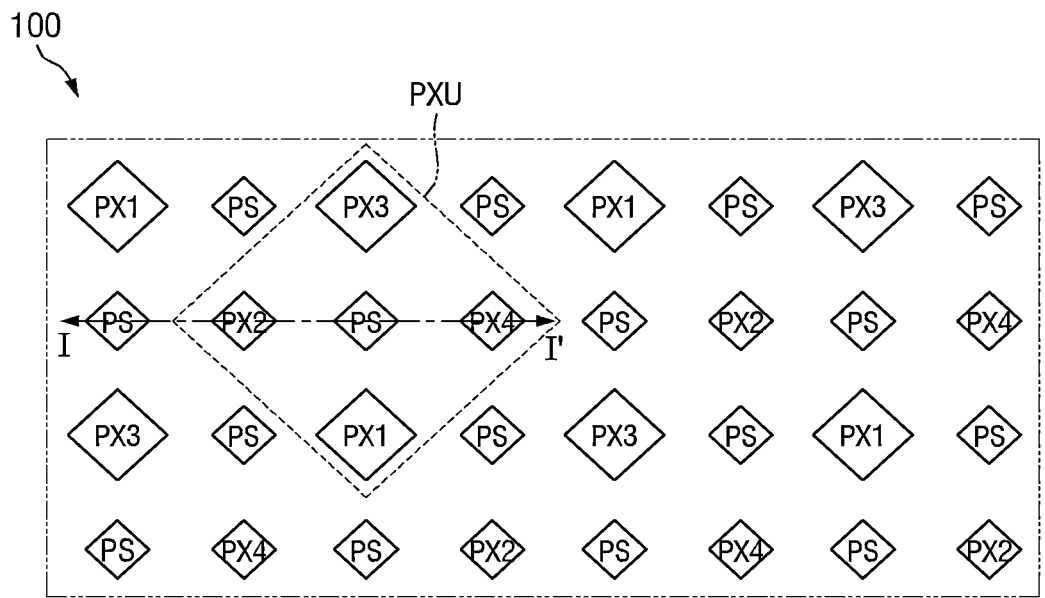
100
PXU
PX: PX1, PX2, PX3, PX4
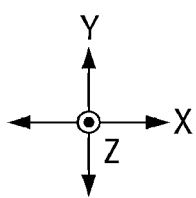

FIG. 9

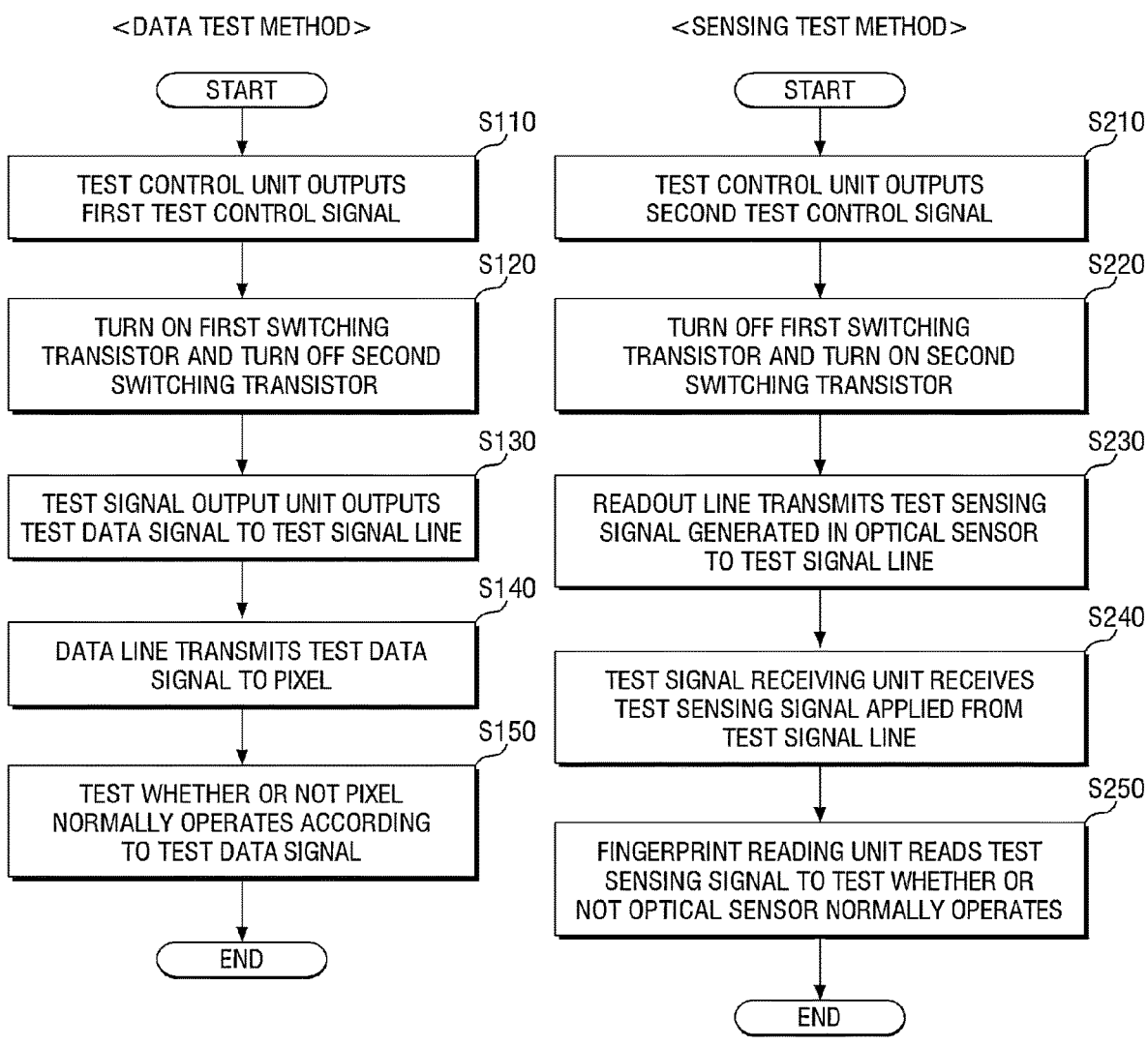

<DATA TEST METHOD>

START

S110 TEST CONTROL UNIT OUTPUTS FIRST TEST CONTROL SIGNAL

S120 TURN ON FIRST SWITCHING TRANSISTOR AND TURN OFF SECOND SWITCHING TRANSISTOR

S130 TEST SIGNAL OUTPUT UNIT OUTPUTS TEST DATA SIGNAL TO TEST SIGNAL LINE

S140 DATA LINE TRANSMITS TEST DATA SIGNAL TO PIXEL

S150 TEST WHETHER OR NOT PIXEL NORMALLY OPERATES ACCORDING TO TEST DATA SIGNAL

END

<SENSING TEST METHOD>

START

S210 TEST CONTROL UNIT OUTPUTS SECOND TEST CONTROL SIGNAL

S220 TURN OFF FIRST SWITCHING TRANSISTOR AND TURN ON SECOND SWITCHING TRANSISTOR

S230 READOUT LINE TRANSMITS TEST SENSING SIGNAL GENERATED IN OPTICAL SENSOR TO TEST SIGNAL LINE

S240 TEST SIGNAL RECEIVING UNIT RECEIVES TEST SENSING SIGNAL APPLIED FROM TEST SIGNAL LINE

S250 FINGERPRINT READING UNIT READS TEST SENSING SIGNAL TO TEST WHETHER OR NOT OPTICAL SENSOR NORMALLY OPERATES

END

TEST SYSTEM, METHOD OF TESTING DISPLAY CELL USING THE SAME, AND DISPLAY DEVICE

CROSS-REFERENCE TO RELATED APPLICATION

This application claims priority to Korean Patent Application No. 10-2022-0038707 filed on Mar. 29, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a test system, a method of testing a display cell using the same, and a display device.

2. Description of the Related Art

As the information society develops, the demand for a display device for displaying an image is increasing in various forms. For example, the display device is applied to various electronic devices such as a smart phone, a digital camera, a notebook computer, a navigation system, a smart watch, and a smart television. The display device may be a flat panel display device such as a liquid crystal display device, a field emission display device, or an organic light emitting display device.

Research and development on a technology for integrating sensors for touch recognition or fingerprint recognition into the display device is being conducted recently. A display panel in which the sensors for touch recognition or fingerprint recognition are integrated may be tested for electrical defects or the like in a display cell state before a module process.

SUMMARY

Aspects of the present disclosure provide a test system for testing a display cell before a module process of a display panel in which sensors for touch recognition or fingerprint recognition are integrated.

Aspects of the present disclosure also provide a method of testing a display cell using the test system.

Aspects of the present disclosure also provide a display device according to a module process of the display cell.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a test system comprising: a display cell including a pixel and a data line connected to the pixel, an optical sensor and a readout line connected to the optical sensor, and a signal selection unit for selectively connecting a test signal line to any one of the data line and the readout line; and a test member configured to apply a first test control signal to the signal selection unit in a data test mode and apply a second test control signal to the signal selection unit in a sensing test mode, wherein the signal selection unit includes: a first switching transistor configured to be turned on in response to the first test control signal to connect the test signal line to the data line; and a second switching transistor configured to be turned on in response to the second test control signal to connect the test signal line to the readout line.

The first switching transistor and the second switching transistor may be not turned on at the same time.

The signal selection unit may include: a first test control line configured to transmit the first test control signal to the first switching transistor, and a second test control line configured to transmit the second test control signal to the second switching transistor.

The test member may include a test signal output unit for applying a test data signal to the pixel in the data test mode, and the test data signal may be a direct current (DC) data voltage.

The test system may further comprises a test pad unit disposed between the signal selection unit and the test member, and configured to receive the first test control signal, the second test control signal, the test data signal, and the test sensing signal; and a cutting portion disposed between the signal selection unit and the test pad unit.

The test system may further comprises a first fan-out unit disposed between the signal selection unit and the pixel, and including data pads connected to the data line, wherein the cutting portion may be disposed between the first fan-out unit and the signal selection unit.

The test member may include: a test signal receiving unit configured to receive a test sensing signal from the optical sensor in the sensing test mode, and a test signal reading unit configured to read the test sensing signal received from the test signal receiving unit and determine whether or not the optical sensor normally operates.

The pixel may include a first pixel and a second pixel disposed adjacent to the first pixel, the data line includes a first data line connected to the first pixel and a second data line connected to the second pixel, the first data line and the second data line being electrically connected to the test signal line of the signal selection unit, the optical sensor may include a first optical sensor and a second optical sensor disposed adjacent to the first optical sensor, the readout line may include a first readout line connected to the first optical sensor and a second readout line connected to the second optical sensor, the first readout line and the second readout line being electrically connected to the test signal line of the signal selection unit, the second switching transistor of the signal selection unit may include a first sub-transistor connected to the first data line and a second sub-transistor connected to the second data line, and the first sub-transistor and the second sub-transistor may be sequentially turned on.

The first switching transistor of the signal selection unit may include a third sub-transistor connected to the first readout line and a fourth sub-transistor connected to the second readout line, and the third sub-transistor and the fourth sub-transistor may be simultaneously turned on.

According to another aspect of the present disclosure, there is provided a method of testing a display cell, the method comprising: outputting, by a test member, a first test control signal in a data test mode; outputting, by the test member, a second test control signal in a sensing test mode; outputting, by an optical sensor, a test sensing signal to a readout line connected to the optical sensor, the test sensing signal being generated according to external light; connecting a test signal line of a signal selection unit to the readout line in response to the second test control signal; and connecting a data line connected to a pixel to the test signal line in response to the first test control signal.

The signal selection unit may include a first switching transistor and a second switching transistor, the connecting of the data line connected to the pixel to the test signal line in response to the first test control signal may include turning on the first switching transistor, and the connecting of the test signal line of the signal selection unit to the readout line in response to the second test control signal may include turning on the second switching transistor.

The method may further comprise: receiving, by the test member, the test sensing signal from the optical sensor in the sensing test mode and test whether or not the optical sensor normally operates; and applying, by the test member, a test data signal that is a DC data voltage to the pixel in the data test mode.

According to another aspect of the present disclosure, there is provided a display device comprising: a substrate; a pixel and an optical sensor disposed on the substrate; a data line connected to the pixel; a readout line connected to the optical sensor; a first floating line and a second floating line exposed through one side surface of the substrate; a first switching transistor connected between the first floating line and the data line; and a second switching transistor connected between the second floating line and the readout line.

The display device may further comprise a third floating line and a fourth floating line exposed through another side surface of the substrate disposed adjacent to the one side surface of the substrate, wherein the third floating line may be connected to a gate electrode of the first switching transistor, and the fourth floating line may be connected to a gate electrode of the second switching transistor.

The first floating line, the second floating line, the third floating line, and the fourth floating line may be electrically floated.

The third floating line and the fourth floating line may be connected to a gate high voltage line or a gate low voltage line.

The display device may further comprise a first fan-out unit including a data pad connected to the data line, wherein a first electrode of the first switching transistor may be connected to the first floating line and a second electrode of the first switching transistor may be connected to the data pad.

The display device may further comprise a second fan-out unit including a sensing pad connected to the readout line, wherein a first electrode of the second switching transistor may be connected to the second floating line and a second electrode of the second switching transistor may be connected to the sensing pad.

The optical sensor may include: a photoelectric conversion element for generating a photocurrent according to external light; and a first sensing transistor for controlling a sensing current flowing through the readout line according to the photocurrent.

The pixel may include: a light emitting element that emits light according to a data voltage, and a common voltage line electrically connecting a cathode electrode of the light emitting element and a sensing cathode electrode of the photoelectric conversion element to each other.

According to the test system according to the exemplary embodiments, since electrical defects of signal lines may be tested according to modes in a display cell state, a module process yield may be improved and manufacturing costs may be reduced.

According to the method of testing a display cell using the test system according to the exemplary embodiments, since electrical defects of signal lines may be tested according to modes in a display cell state, the test method that may improve module process yield and reduce manufacturing costs may be used.

According to the display device according to the exemplary embodiment, since the display device having the electrical defect tested can be manufactured, a module process yield may be improved and manufacturing costs may be reduced.

However, the effects of the exemplary embodiments are not restricted to the one set forth herein. The above and other effects of the exemplary embodiments will become more apparent to one of daily skill in the art to which exemplary embodiments pertain by referencing the claims.

BRIEF DESCRIPTION OF THE DRAWINGS

The above and other aspects and features of the present disclosure will become more apparent by describing in detail exemplary embodiments thereof with reference to the attached drawings, in which:

FIG. 2 is a plan layout view of pixels and optical sensors of a display cell according to an exemplary embodiment;

FIG. 9 is a flowchart for describing a data test method and a sensing test method of a display cell according to an exemplary embodiment;

DETAILED DESCRIPTION OF THE EMBODIMENTS

Figure 1:
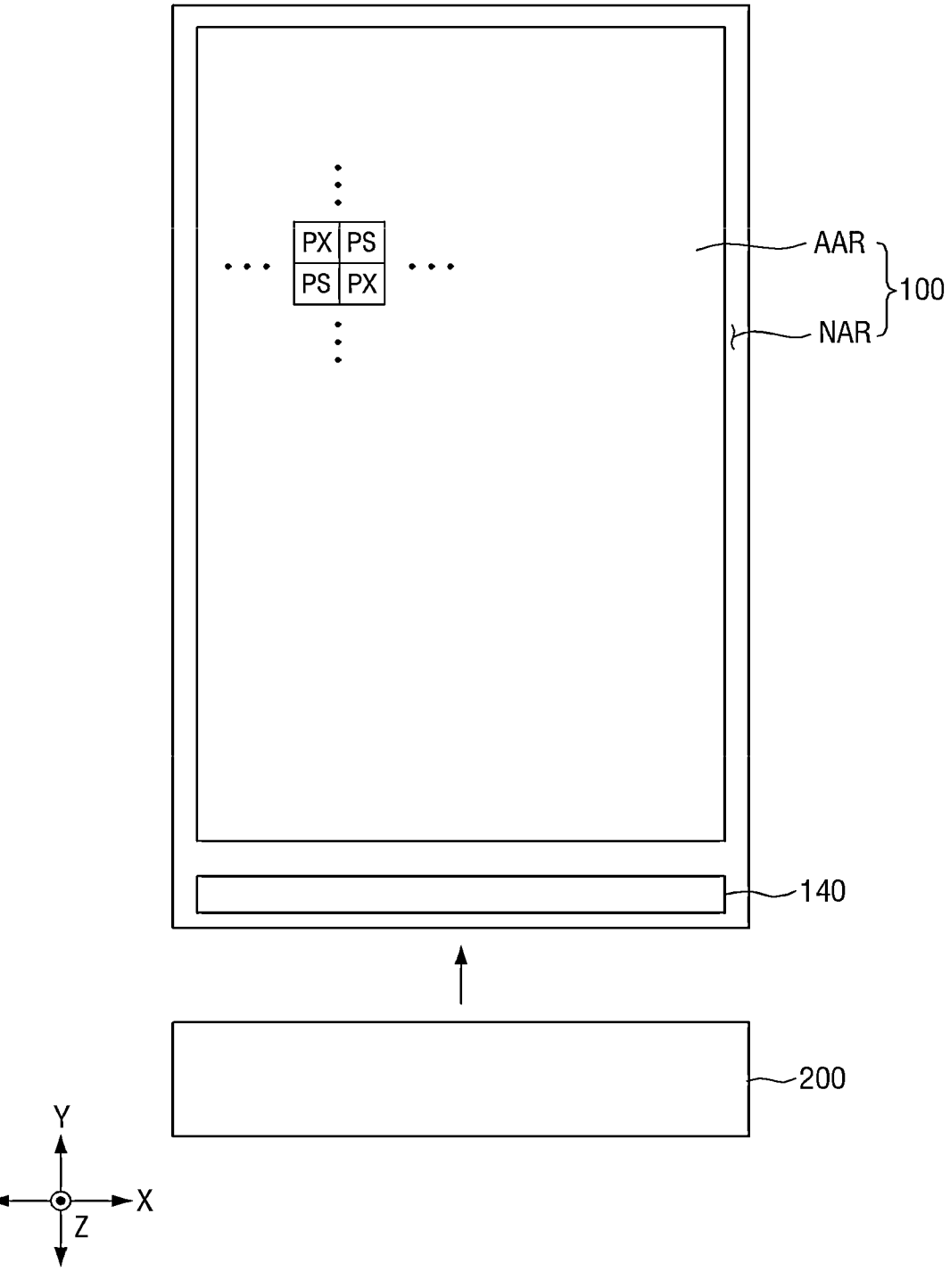
FIG. 1 is a conceptual view for describing a test system according to an exemplary embodiment.

Embodiments of the inventive concept will now be described more fully hereinafter with reference to the accompanying drawings, in which preferred embodiments of the inventive concept are shown. The inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, specific exemplary embodiments will be described with reference to the accompanying drawings.

FIG. 1 is a conceptual view for describing a test system according to an exemplary embodiment.

Referring to FIG. 1, a test system includes a display cell 100 and a test member 200. In FIG. 1, a first direction X, a second direction Y, and a third direction Z are indicated. The first direction X may be a direction parallel to one side of the display cell 100 in a plan view, for example, a horizontal direction of the display cell 100. The second direction Y may be a direction parallel to the other side in contact with the one side of the display cell 100 in a plan view and may be a vertical direction of the display cell 100. Hereinafter, for convenience of explanation, one side in the first direction X refers to a left direction in a plan view and the other side in the first direction X refers to a right direction in a plan view, and one side in the second direction Y refers to a downward direction in a plan view and the other side in the second direction Y refers to an upward direction in a plan view. The third direction Z may be a thickness direction of the display cell 100. However, it should be understood that the directions mentioned in the exemplary embodiments refer to relative directions, and the exemplary embodiments are not limited to the mentioned directions.

Unless otherwise defined, in the present specification, "upper side" and "top surface" expressed with respect to the third direction Z mean a side of a display surface with respect to the display cell 100, and "lower side", "bottom surface", and "rear surface" refer to an opposite side of the display surface with respect to the display cell 100.

The display cell 100 includes an active region AAR on which an image is displayed and a non-active region NAR around the active region AAR. The active region AAR includes a display region displaying an image. The active region AAR may completely overlap with the display region. A plurality of pixels PX displaying an image may be disposed in the display region. Each pixel PX may include a light emitting element ('EL' in FIG. 3).

In addition, the active region AAR further includes a fingerprint sensing region. The fingerprint sensing region is a region that responds to light and is a region configured to sense an amount or a wavelength of incident light. The fingerprint sensing region may overlap the display region. For example, the fingerprint sensing region may be disposed only in a limited region necessary for fingerprint recognition within the active region AAR. In this case, the fingerprint sensing region may overlap a portion of the display region, but may not overlap another portion of the display region. As another example, the fingerprint sensing region may be defined as a region exactly the same as the active region AAR. In this case, all of a front surface of the active region AAR may be utilized as a region for fingerprint sensing. A plurality of optical sensors PS that respond to light may be disposed in the fingerprint sensing region. Each optical sensor PS may include a photoelectric conversion element ('PD' in FIG. 3) that senses incident light and converts the sensed incident light into an electrical signal.

The non-active region NAR may be disposed around the active region AAR. In the non-active region NAR, signal lines transmitting signals for driving the pixels PX, the optical sensors PS of the active region AAR, a plurality of data pads, and a plurality of sensing pads may be disposed. A test pad unit 140 may be disposed in the non-active region NAR. The test pad unit 140 is connected to each of the plurality of data pads and the plurality of sensing pads to receive a test control signal, a test data signal, and a test sensing signal provided from the test member 200.

The test member 200 provides a plurality of control signals and test signals to the display cell 100, and receives a plurality of control signals and test signals from the display cell 100 before a module process and a cutting process of the display cell 100. For example, the test member 200 provides test data signals to the plurality of data pads during a data test mode, or receives test detection signals from the plurality of detection pads during an optical sensor test mode.

FIG. 2 is a plan layout view of pixels and optical sensors of a display cell according to an exemplary embodiment.

Referring to FIG. 2, a plurality of pixels PX and a plurality of optical sensors PS may be repeatedly disposed in the display cell 100.

The plurality of pixels PX may include a first pixel PX1, a second pixel PX2, a third pixel PX3, and a fourth pixel PX4. For example, the first pixel PX1 may emit light of a red wavelength, the second pixel PX2 and the fourth pixel PX4 may emit light of a green wavelength, and the third pixel PX3 may emit light of a blue wavelength. The plurality of pixels PX may include a plurality of light emitting regions emitting light, respectively. The plurality of optical sensors PS may include a plurality of light sensing regions for sensing incident light.

The first pixel PX1, the second pixel PX2, the third pixel PX3, and the fourth pixel PX4 and the plurality of optical sensors PS may be alternately arranged in the first direction X and the second direction Y. In one exemplary embodiment, the first pixel PX1 and the third pixel PX3 may be alternately arranged in a first row along the first direction X, and the second pixel PX2 and the fourth pixel PX4 may be repeatedly arranged along the first direction X in a second row adjacent to the first row. The pixels PX in the first row may be alternately disposed in the first direction X with respect to the pixels PX in the second row. The arrangement of the first row and the second row may be repeated up to an n-th row.

Each of the optical sensors PS may be disposed between adjacent pixels in the first direction X and the second direction Y. Each of the optical sensors PS may be disposed between the first pixel PX1 and the third pixel PX3 in the first row to be spaced apart from the first pixel PX1 and the third pixel PX3. The first pixel PX1, the optical sensor PS, and the third pixel PX3 may be alternately arranged along the first direction X. Each of the optical sensors PS may be disposed between the second pixel PX2 and the fourth pixel PX4 in the second row to be spaced apart from the second pixel PX2 and the fourth pixel PX4. The second pixel PX2, the optical sensor PS, and the fourth pixel PX4 may be alternately arranged along the first direction X. The number of optical sensors PS in the first row may be the same as the number of optical sensors PS in the second row. The arrangement of the first row and the second row may be repeated up to an n-th row.

As another example, the optical sensor PS may be disposed between the second pixel PX2 and the fourth pixel PX4 in the second row, and may not be disposed between the first pixel PX1 and the third pixel PX3 in the first row. That is, the optical sensor PS may not be disposed in the first row.

Sizes of the light emitting regions of the respective pixels PX may be different. The size of the light emitting regions of the second pixel PX2 and the fourth pixel PX4 may be smaller than the size of the light emitting region of the first pixel PX1 or the third pixel PX3. A shape of each of the pixels PX is illustrated as a rhombus, but the shape of each of the pixels PX is not limited thereto, and the shape of each of the pixels PX may be a rectangle, an octagon, a circle, or other polygons.

One pixel unit PXU may include one first pixel PX1, one second pixel PX2, one third pixel PX3, and one fourth pixel PX4. The pixel unit PXU refers to a group of color pixels capable of expressing grayscale.

Figure 3:
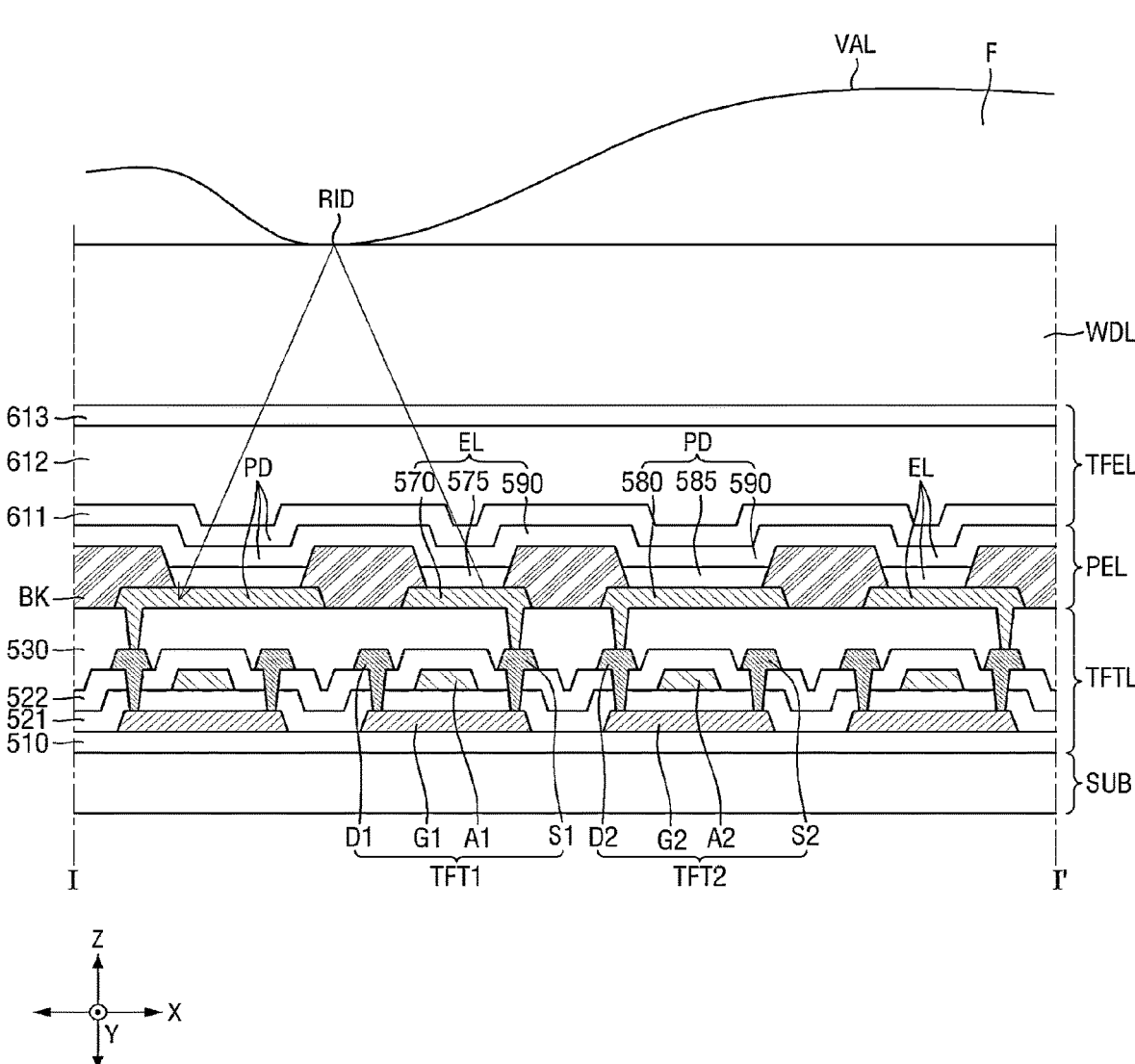
FIG. 3 is a cross-sectional view taken along line I-I' of FIG. 2.

FIG. 3 is a cross-sectional view taken along line I-I' of FIG. 2.

Referring to FIG. 3, a buffer layer 510 is disposed on a substrate SUB. The buffer layer 510 may include silicon nitride, silicon oxide, or silicon oxynitride.

A first thin film transistor TFT1 and a second thin film transistor TFT2 may be disposed on the buffer layer 510.

A plurality of thin film transistors TFT1 and TFT2 may include semiconductor layers A1 and A2, a gate insulating layer 521 disposed on a portion of the semiconductor layers A1 and A2, gate electrodes G1 and G2 disposed on the gate insulating layer 521, an interlayer insulating film 522 covering each of the semiconductor layers A1 and A2 and each of the gate electrodes G1 and G2, and source electrodes S1 and S2 and drain electrodes D1 and D2 disposed on the interlayer insulating film 522.

The semiconductor layers A1 and A2 may form channels of the first thin film transistor TFT1 and the second thin film transistor TFT2, respectively. The semiconductor layers A1 and A2 may include polycrystalline silicon. In another exemplary embodiment, the semiconductor layers A1 and A2 may include single crystal silicon, low temperature polycrystalline silicon, amorphous silicon, or an oxide semiconductor. The oxide semiconductor may include a binary compound (ABx), a ternary compound (ABxCy), and a quaternary compound (ABxCyDz) containing, for example, indium, zinc, gallium, tin, titanium, aluminum, hafnium (Hf), zirconium (Zr), magnesium (Mg), and the like. Each of the semiconductor layers A1 and A2 may include a channel region, and a source region and a drain region doped with impurities.

The gate insulating layer 521 is disposed on the semiconductor layers A1 and A2. The gate insulating layer 521 electrically insulates the first gate electrode G1 from the first semiconductor layer A1, and electrically insulates the second gate electrode G2 from the second semiconductor layer A2. The gate insulating layer 521 may be formed of an insulating material, for example, silicon oxide (SiOx), silicon nitride (SiNx), or metal oxide.

The first gate electrode G1 of the first thin film transistor TFT1 and the second gate electrode G2 of the second thin film transistor TFT2 are disposed on the gate insulating layer 521. The gate electrodes G1 and G2 may be formed to overlap the channel regions on an upper side of the channel regions of the semiconductor layers A1 and A2, that is, on the gate insulating layer 521, respectively.

The interlayer insulating film 522 may be disposed on the gate electrodes G1 and G2. The interlayer insulating film 522 may include an inorganic insulating material such as silicon oxide (SiOx), silicon nitride (SiNx), silicon oxynitride, hafnium oxide, or aluminum oxide. In addition, although not illustrated, the interlayer insulating film 522 may include a plurality of insulating films, and may further include a conductive layer forming a second electrode of a capacitor between the insulating films.

The source electrodes S1 and S2 and the drain electrodes D1 and D2 are disposed on the interlayer insulating film 522. A first source electrode S1 of the first thin film transistor TFT1 may be electrically connected to a drain region of the first semiconductor layer A1 through a contact hole formed through the interlayer insulating film 522 and the gate insulating layer 521. A second source electrode S2 of the second thin film transistor TFT2 may be electrically connected to a drain region of the second semiconductor layer A2 through a contact hole formed through the interlayer insulating film 522 and the gate insulating layer 521. Each of the source electrodes S1 and S2 and the drain electrodes D1 and D2 may include one or more metals selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A planarization layer 530 may be formed on the interlayer insulating film 522 to cover each of the source electrodes S1 and S2 and the drain electrodes D1 and D2. The planarization layer 530 may be formed of an organic insulating material or the like. The planarization layer 530 may have a flat surface and may include a contact hole exposing one of the source electrodes S1 and S2 and the drain electrodes D1 and D2, respectively.

An optical element layer PEL may be disposed on the planarization layer 530. The optical element layer PEL may include a light emitting element EL, a photoelectric conversion element PD, and a bank layer BK. The light emitting element EL may include a pixel electrode 570, a light emitting layer 575, and a common electrode 590, and the photoelectric conversion element PD may include a first electrode 580, a photoelectric conversion layer 585, and a common electrode 590.

The pixel electrode 570 of the light emitting element EL may be disposed on the planarization layer 530. The pixel electrode 570 may be provided for each pixel PX. The pixel electrode 570 may be connected to the first source electrode S1 or the first drain electrode D1 of the first thin film transistor TFT1 through a contact hole formed through the planarization layer 530.

The pixel electrode 570 of the light emitting element EL is not limited thereto, but may have a single layer structure of molybdenum (Mo), titanium (Ti), copper (Cu), or aluminum (Al), or may have a stacked layer structure, for example, a multilayer structure of Indium-Tin-Oxide (ITO), Indium-Zinc-Oxide (IZO), Zinc Oxide (ZnO), Indium Oxide (In$_2$O$_3$), and ITO/Mg, ITO/MgF, ITO/Ag, and ITO/Ag/ITO containing silver (Ag), magnesium (Mg), aluminum (Al), platinum (Pt), lead (Pb), gold (Au), and nickel (Ni).

The first electrode 580 of the photoelectric conversion element PD may also be disposed on the planarization layer 530. The first electrode 580 may be provided for each optical sensor PS. The first electrode 580 may be connected to the second source electrode S2 or the second drain electrode D2 of the second thin film transistor TFT2 through a contact hole formed through the planarization layer 530.

The first electrode 580 of the photoelectric conversion element PD is not limited thereto, but may have a single layer structure of molybdenum (Mo), titanium (Ti), copper (Cu), or aluminum (Al), or may have a multilayer structure of ITO/Mg, ITO/MgF, ITO/Ag, and ITO/Ag/ITO.

The bank layer BK may be disposed on the pixel electrode 570 and the first electrode 580. The bank layer BK may form an opening that is formed in a region overlapping the pixel electrode 570 to expose the pixel electrode 570. A region in which the exposed pixel electrode 570 and the light emitting layer 575 overlap may be defined as a light emitting region emitting different light according to each of the pixels PX (PX1, PX2, PX3, and PX4).

In addition, the bank layer BK may form an opening that is formed in a region overlapping the first electrode 580 to expose the first electrode 580. The opening exposing the first electrode 580 provides a space in which the photoelectric conversion layer 585 of each optical sensor PS is formed, and a region in which the exposed first electrode 580 and the photoelectric conversion layer 585 overlap may be defined as a light sensing portion.

The bank layer BK may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). As another example, the bank layer BK may also include an inorganic material such as silicon nitride.

The light emitting layer 575 may be disposed on the pixel electrode 570 of the light emitting element EL exposed by the opening of the bank layer BK. The light emitting layer 575 may include a high molecular material or a low molecular material, and may emit red, green, or blue light for each pixel PX. The light emitted from the light emitting layer 575 may contribute to image display or function as a light source incident on the optical sensor PS. For example, a light source of a green wavelength emitted from the light emitting regions of the second pixel PX2 and the fourth pixel PX4 may function as a light source incident on the light sensing region of the optical sensor PS.

When the light emitting layer 575 is formed of an organic material, a hole injecting layer HIL and a hole transporting layer HTL may be disposed on a lower side of each light emitting layer 575, and an electron injecting layer EIL and an electron transporting layer ETL may be stacked on an upper side of each light emitting layer 575. These layers may be a single layer or multiple layers made of the organic material.

The photoelectric conversion layer 585 may be disposed on the first electrode 580 of the photoelectric conversion element PD exposed by the opening of the bank layer BK. A region in which the exposed first electrode 580 and the photoelectric conversion layer 585 overlap may be defined as a light sensing region of each optical sensor PS. The photoelectric conversion layer 585 may generate photocharges in proportion to incident light. The incident light may be light emitted from the light emitting layer 575 and then reflected and entered into the photoelectric conversion layer 585, or may be light provided from the outside regardless of the light emitting layer 575. The charges generated and accumulated in the photoelectric conversion layer 585 may be converted into electrical signals required for sensing.

The photoelectric conversion layer 585 may include an electron donating material and an electron accepting material. The electron donating material may generate donor ions in response to light, and the electron accepting material may generate acceptor ions in response to light. When the photoelectric conversion layer 585 is formed of the organic material, the electron donating material may include a compound such as subphthalocyanine (SubPc) or dibutylphosphate (DBP), but the material forming the electron donating material is not limited thereto. The electron accepting material may include a compound such as fullerene, a fullerene derivative, or perylene diimide, but the material forming the electron accepting material is not limited thereto.

Alternatively, when the photoelectric conversion layer 585 is formed of an inorganic material, the photoelectric conversion element PD may be a pn-type or pin-type phototransistor. For example, the photoelectric conversion layer 585 may have a structure in which an N-type semiconductor layer, an I-type semiconductor layer, and a P-type semiconductor layer are sequentially stacked.

When the photoelectric conversion layer 585 is formed of the organic material, a hole injecting layer HIL and a hole transporting layer HTL may be disposed on a lower side of each photoelectric conversion layer 585, and an electron injecting layer EIL and an electron transporting layer ETL may be stacked on an upper of each photoelectric conversion layer 585. These layers may be a single layer or multiple layers made of the organic material.

The common electrode 590 may be disposed on the light emitting layer 575, the photoelectric conversion layer 585, and the bank layer BK. The common electrode 590 may be disposed across all of the plurality of pixels PX and the plurality of light sensors PS in a form covering the light emitting layer 575, the photoelectric conversion layer 585, and the bank layer BK. The common electrode 590 may include a conductive material having a low work function, for example, Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg, etc.). Alternatively, the common electrode 590 may include a transparent metal oxide, for example, indium-tin-oxide (ITO), indium-zinc-oxide (IZO), or zinc oxide (ZnO).

Although not limited thereto, the common electrode 590 may be commonly disposed on the light emitting layer 575 and the photoelectric conversion layer 585. In this case, a cathode electrode of the light emitting element EL and a sensing cathode electrode of the photoelectric conversion element PD may be electrically connected to each other. For example, a common voltage line connected to the cathode electrode of the light emitting element EL may be simultaneously connected to the sensing cathode electrode of the photoelectric conversion element PD.

An encapsulation layer TFEL may be disposed on the optical element layer PEL. The encapsulation layer TFEL may include at least one inorganic film to prevent oxygen or moisture from permeating into each of the light emitting layer 575 and the photoelectric conversion layer 585. In addition, the encapsulation layer TFEL may include at least one organic film to protect each of the light emitting layer 575 and the photoelectric conversion layer 585 from foreign materials such as dust. For example, the encapsulation layer TFEL may be formed in a structure in which a first inorganic film 611, an organic film 612, and a second inorganic film 613 are sequentially stacked. The first inorganic film 611 and the second inorganic film 613 may be formed of multiple films in which one or more inorganic films of a silicon nitride layer, a silicon oxynitride layer, a silicon oxide layer, a titanium oxide layer, and an aluminum oxide layer are alternately stacked. The organic film 612 may be an organic film made of an acryl resin, an epoxy resin, a phenolic resin, a polyamide resin, a polyimide resin, or the like.

A window WDL may be disposed on the encapsulation layer TFEL. The window WDL may be disposed on the display device 1 after a scribing process which separates each liquid crystal display panel (the display cell 100) from a mother glass to protect the display device 1. The window WDL may be made of glass or plastic.

Meanwhile, FIG. 3 is a cross-sectional view illustrating a state in which a user's finger is in contact with the window WDL of the display device 1. Fingerprint F includes ridges RID having a specific pattern and valleys VAL between the ridges RID. In a state in which the fingerprint F is in contact with a top surface of the window WDL, the ridge RID portion of the fingerprint F is in contact with the top surface of the window WDL, whereas the valley VAL portion of the fingerprint F is not in contact with the window WDL. That is, the top surface of the window WDL is in contact with air in the valley (VAL) portion.

When the fingerprint F is in contact with the top surface of the window WDL, the light output from the light emitting region of the pixel PX may be reflected from the ridge RID and the valley VAL of the fingerprint F. In this case, since a refractive index of the fingerprint F and a refractive index of air are different, the amount of light reflected from the ridge RID of the fingerprint F and the amount of light reflected from the valley VAL thereof may be different from each other. Accordingly, the ridge RID portion and the valley VAL portion of the fingerprint F may be derived based on a difference in the amount of reflected light, that is, light incident on the optical sensor PS. Since the optical sensor PS outputs an electrical signal according to the difference in light (or photocurrent), the pattern of the fingerprint F of the finger may be identified.

Figure 4:
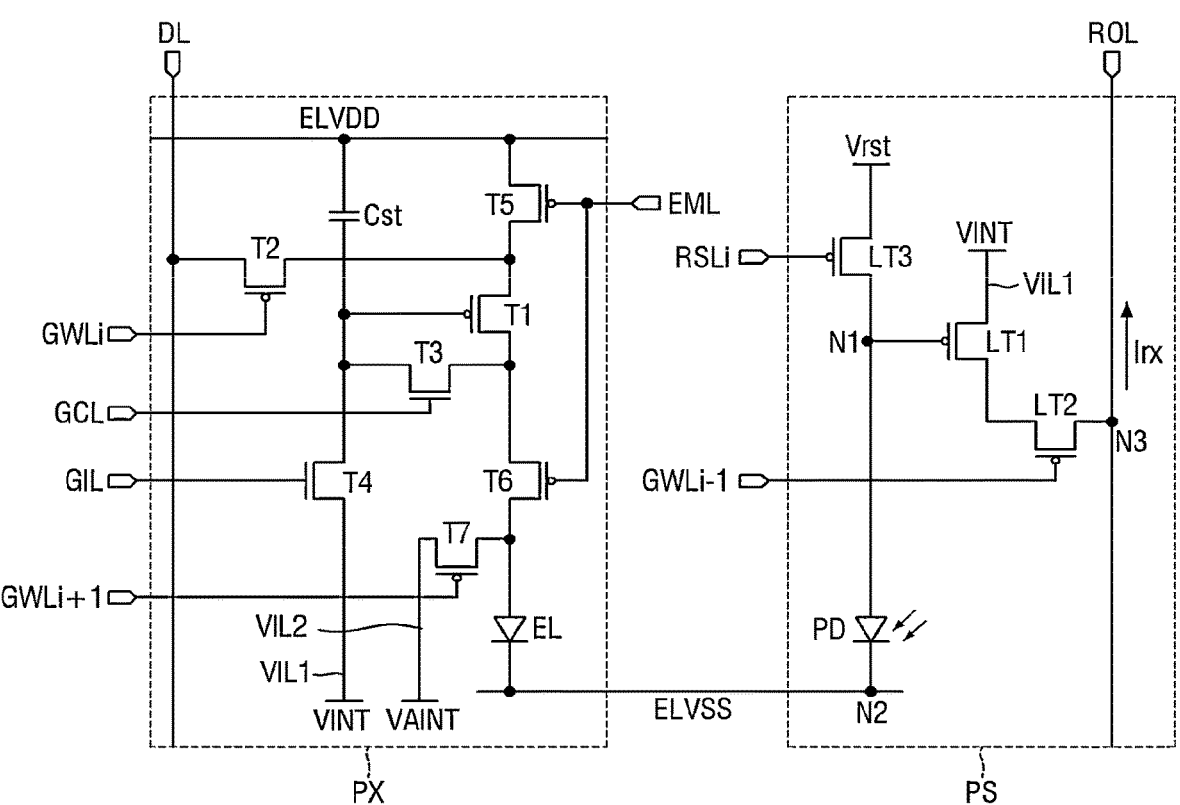
FIG. 4 is a circuit diagram of a pixel and an optical sensor according to an exemplary embodiment.

FIG. 4 is a circuit diagram of a pixel and an optical sensor according to an exemplary embodiment.

Each of the plurality of pixels PX may include a light emitting element EL and a display driver controlling the amount of light emitted from the light emitting element EL. The display driver may include a plurality of transistors, various signal lines, and a first capacitor Cst to apply a driving current to the light emitting element EL. The plurality of transistors may include first to seventh transistors T1, T2, T3, T4, T5, T6, and T7.

Each of the pixels PX may be connected to a scan initialization line GILi, a scan control line GCLi, an i-th scan line GWLi (i is a positive integer), an i+1-th scan line GWLi+1, a light emitting control line EMLi, and a data line DL. In addition, each of the pixels PX may be connected to a driving voltage line to which a driving voltage ELVDD is applied, a common voltage line to which a common voltage ELVSS is applied, a first initialization voltage line VIL1 to which a first initialization voltage VINT is applied, and a second initialization voltage line VIL2 to which a second initialization voltage VAINT is applied.

The first transistor T1 controls a source-drain current Ids (hereinafter referred to as a "driving current") according to a data voltage applied to a gate electrode thereof. The driving current Ids flowing through a channel of the first transistor T1 is proportional to a square of a difference between a gate-source voltage Vgs of the first transistor T1 and a threshold voltage thereof as expressed in Equation 1.

$$Isd = k' \times (Vsg - |Vth|)^2 \qquad \text{[Equation 1]}$$

In Equation 1, k' is a proportionality coefficient determined by the structure and physical characteristics of the first transistor T1, Vgs is a gate-source voltage of the first transistor T1, and Vth is a threshold voltage of the first transistor T1.

The first transistor T1 may control the driving current supplied to the light emitting element EL. A gate electrode of the first transistor T1 may be connected to a first electrode of the third transistor T3 and one electrode of the first capacitor Cst, a first electrode thereof may be connected to a second electrode of the second transistor T2 and a second electrode of the fifth transistor T5, and a second electrode thereof may be connected to a second electrode of the third transistor T3 and a first electrode of the sixth transistor T6. The first transistor T1 may be a p-type transistor and may include a polycrystalline semiconductor.

The light emitting element EL emits light according to the driving current Ids. The amount of light emitted from the light emitting element EL may be proportional to the driving current Ids.

The light emitting element EL may be an organic light emitting diode including an anode electrode, a cathode electrode, and an organic light emitting layer disposed between the anode electrode and the cathode electrode. Alternatively, the light emitting element EL may be an inorganic light emitting element including an anode electrode, a cathode electrode, and an inorganic semiconductor disposed between the anode electrode and the cathode electrode. Alternatively, the light emitting element EL may be a quantum dot light emitting element including an anode electrode, a cathode electrode, and a quantum dot light emitting layer disposed between the anode electrode and the cathode electrode. Alternatively, the light emitting element EL may be a micro light emitting diode. In FIG. 3, the anode electrode of the light emitting element EL corresponds to the pixel electrode 570, and the cathode electrode thereof corresponds to the common electrode 590.

The anode electrode of the light emitting element EL may be connected to a second electrode of the sixth transistor T6 and a second electrode of the seventh transistor T7, and the cathode electrode thereof may be connected to the common voltage line.

The second transistor T2 may be turned on by the i-th scan signal of the i-th scan line GWLi to connect the first electrode of the first transistor T1 and the data line DL to each other. A gate electrode of the second transistor T2 may be connected to the i-th scan line GWLi, a first electrode thereof may be connected to the data line DL, and a second electrode thereof may be connected to the first electrode of the first transistor T1.

The third transistor T3 may be turned on by the scan control signal of the scan control line GCLi to connect the gate electrode and the second electrode of the first transistor T1 to each other. That is, when the third transistor T3 is turned on, the gate electrode of the first transistor T1 and the second electrode are connected to each other, so that the first transistor T1 may be driven as a diode. A gate electrode of the third transistor T3 may be connected to the scan control line GCLi, a second electrode thereof may be connected to the second electrode of the first transistor T1, and a first electrode thereof may be connected to the gate electrode of the first transistor T1.

The fourth transistor T4 may be turned on by the scan initialization signal of the scan initialization line GILi to connect the gate electrode of the first transistor T1 and the first initialization voltage line VIL1 to each other. In this case, the gate electrode of the first transistor T1 may be discharged to the first initialization voltage VINT of the first initialization voltage line VIII. A gate electrode of the fourth transistor T4 may be connected to the scan initialization line GILi, a first electrode thereof may be connected to the first initialization voltage line VIL1, and a second electrode thereof may be connected to the gate electrode of the first transistor T1.

The fifth transistor T5 may be turned on by the light emitting control signal of the light emitting control line EMLi to connect the first electrode of the first transistor T1 and the driving voltage line to each other. A gate electrode of the fifth transistor T5 may be connected to the light emitting control line EMLi, a first electrode thereof may be connected to the driving voltage line for applying the driving voltage ELVDD, and a second electrode thereof may be connected to the first electrode of the first transistor T1.

The sixth transistor T6 may be turned on by the light emitting control signal of the light emitting control line EMLi to connect the second electrode of the first transistor T1 and the anode electrode of the light emitting element EL to each other. A gate electrode of the sixth transistor T6 may be connected to the light emitting control line EMLi, a first electrode thereof may be connected to the second electrode of the first transistor T1, and a second electrode thereof may be connected to the anode electrode of the light emitting element EL.

When both the fifth transistor T5 and the sixth transistor T6 are turned on, the driving current Ids may be supplied to the light emitting element EL.

The seventh transistor T7 may be turned on by the i+1-th scan signal of the i+1-th scan line GWLi+1 to connect the second initialization voltage line VIL2 and the anode electrode of the light emitting element EL to each other. In this case, the anode electrode of the light emitting element EL may be discharged to the second initialization voltage VAINT. A gate electrode of the seventh transistor T7 may be connected to the i+1-th scan line GWLi+1, a first electrode thereof may be connected to the first initialization voltage line, and a second electrode thereof may be connected to the anode electrode of the light emitting element EL.

The first capacitor Cst may be formed between the gate electrode of the first transistor T1 and the driving voltage line. One electrode of the first capacitor Cst may be connected to the gate electrode of the first transistor T1 and the other electrode thereof may be connected to the driving voltage line. Accordingly, the first capacitor Cst may maintain a potential difference between a voltage of the gate electrode of the first transistor T1 and the driving voltage ELVDD.

In FIG. 4, the active layer of each of the first to seventh transistors T1, T2, T3, T4, T5, T6, and T7 may be formed of any one of poly silicon, amorphous silicon, and an oxide semiconductor. For example, it is illustrated that the first transistor T1, the second transistor T2, the fifth transistor T5, the sixth transistor T6, and the seventh transistor T7 are P-type MOSFETs having a channel formed of a polycrystalline semiconductor, for example, poly silicon or amorphous silicon, and the third transistor T3 and the fourth transistor T4 are N-type MOSFETs having a channel formed of an oxide semiconductor, but the present disclosure is not limited thereto.

Each of the first transistor T1, the second transistor T2, the fifth transistor T5, the sixth transistor T6, and the seventh transistor T7 corresponds to the P-type MOSFET, and may thus output a current flowing from the first electrode thereof to the second electrode thereof in response to a gate low voltage applied to the gate electrode thereof. Each of the third transistor T3 and the fourth transistor T4 corresponds to the N-type MOSFET, and may thus output a current flowing from the first electrode thereof to the second electrode thereof in response to a gate high voltage applied to the gate electrode thereof.

In FIG. 4, the first electrode of each of the first transistor T1, the second transistor T2, the fifth transistor T5, the sixth transistor T6, and the seventh transistor T7 may be a source electrode, and the second electrode thereof may be a drain electrode, but the present disclosure is not limited thereto. The first electrode of each of the third transistor T3 and the fourth transistor T4 may be a drain electrode and the second electrode thereof may be a source electrode, but the present disclosure is not limited thereto.

Each of the plurality of optical sensors PS may include a photoelectric conversion element PD and a sensing driver controlling a sensing current according to the photocurrent of the photoelectric conversion element PD. The sensing driver may include a plurality of sensing transistors and various signal lines for controlling the sensing current generated by the photoelectric conversion element PD. The plurality of sensing transistors may include first to third sensing transistors LT1, LT2, and LT3.

Each of the optical sensors PS may be connected to an i−1-th scan line GWLi−1, an i-th reset line RSLi, and a readout line ROL. In addition, each of the optical sensors PS may be connected to the common voltage line to which the common voltage ELVSS is applied, a reset voltage line to which a reset voltage Vrst is applied, and the first initialization voltage line VIL1 to which the first initialization voltage VINT is applied.

In the present specification, signal lines and voltage lines driving the optical sensor PS may be used as signal lines and voltage lines driving the pixel PX. That is, by minimizing an additional arrangement of signal lines or voltage lines for driving the optical sensor PS in the display cell 100, it is possible to reduce manufacturing costs of the display cell 100 and minimize a bezel region of the display cell 100.

For example, a pixel scan signal driving the pixel PX may be the same signal as a sensor scan signal driving the optical sensor PS. The pixel scan signal and the sensor scan signal may be simultaneously supplied to the pixel PX and the optical sensor PS through the same scan line. That is, an i-th scan line GWLi connected to a gate electrode of a second transistor T2 of an i-th pixel PX may be a sensor scan line connected to a gate electrode of a second sensing transistor LT2 of an i+1-th optical sensor PS. In addition, the cathode electrode of the light emitting element EL and the sensing cathode electrode of the photoelectric conversion element PD may be electrically connected to the common voltage line for applying the common voltage ELVSS, and in cross-sectional view, the cathode electrode of the light emitting element EL and the sensing cathode electrode of the photoelectric conversion element PD may be integrally formed by sharing the common electrode ('590' in FIG. 3).

Each of the photoelectric conversion elements PD may be a light receiving diode including a sensing anode electrode, a sensing cathode electrode, and a photoelectric conversion layer disposed between the sensing anode electrode and the sensing cathode electrode. Each of the photoelectric conversion elements PD may convert light incident from the outside into an electrical signal. The photoelectric conversion element PD may be an inorganic light-receiving diode or a phototransistor formed of a pn-type or pin-type inorganic material. Alternatively, the photoelectric conversion element PD may be an organic light-receiving diode including an electron donating material generating donor ions and an electron accepting material generating acceptor ions. The sensing anode electrode of the photoelectric conversion element PD may be connected to a first node N1, and the sensing cathode electrode thereof may be connected to a second node N2. In FIG. 3, the sensing anode electrode of the photoelectric conversion element PD corresponds to the first electrode 580, and the sensing cathode electrode thereof corresponds to the common electrode 590.

When the photoelectric conversion element PD is exposed to external light, photo-charges may be generated, and the generated photo-charges may be accumulated in the sensing anode electrode of the photoelectric conversion element PD. In this case, a voltage of the first node N1 electrically connected to the sensing anode electrode may increase. When the photoelectric conversion element PD and the readout line ROL are connected to each other according to turn-on of the first and second sensing transistors LT1 and LT2, a sensing voltage may be accumulated in a third node N3 between the readout line ROL and the second sensing transistor LT2 in proportion to the voltage of the first node N1 in which the charges are accumulated.

The first sensing transistor LT1 may be turned on by the voltage of the first node N1 applied to a gate electrode thereof to connect the first initialization voltage line VIL1 and a second electrode of the second sensing transistor LT2 to each other. In this case, a second electrode of the first sensing transistor LT1 may be discharged to the first initialization voltage VINT.

The gate electrode of the first sensing transistor LT1 may be connected to the first node N1, a first electrode thereof may be connected to the first initialization voltage line VIL1, and the second electrode thereof may be connected to a first electrode of the second sensing transistor LT2. The first sensing transistor LT1 may be a source follower amplifier that generates a source-drain current in proportion to the amount of charge of the first node N1 connected to the gate electrode thereof. Meanwhile, the first electrode of the first sensing transistor LT1 is illustrated as being connected to the first initialization voltage line VIL1, but the connection structure of the first sensing transistor LT1 is not limited thereto, and the first sensing transistor LT1 may also be connected to the driving voltage line applying the driving voltage ELVDD or the second initialization voltage line VIL2.

The second sensing transistor LT2 may be turned on by an i−1-th scan signal of the i−1-th scan line GWLi−1 to connect the second electrode of the first sensing transistor LT1 and the readout line ROL to each other. The gate electrode of the second sensing transistor LT2 may be connected to the i−1-th scan line GWLi−1, the first electrode thereof may be connected to the second electrode of the first sensing transistor LT1, and the second electrode thereof may be connected to the third node N3 which is connected to the readout line ROL. The second sensing transistor LT2 may transmit the sensing current generated in the first sensing transistor LT1 to the readout line ROL. The current flowing through the third node N3 may be transmitted to the test member ('200' in FIG. 1) before the module process or a readout circuit ('40' in FIG. 13) after the module process through the readout line ROL.

The third sensing transistor LT3 may be turned on by the reset signal of the i-th reset line RSLi to reset the first node N1 to the reset voltage Vrst. A gate electrode of the third sensing transistor LT3 may be connected to the i-th reset line RSLi, a first electrode thereof may be connected to the reset voltage line, and a second electrode thereof may be connected to the first node N1.

The third sensing transistor LT3 may be a reset transistor that is turned on according to the reset signal to reset the sensing anode electrode of the photoelectric conversion element PD.

It is illustrated in FIG. 4 that the first sensing transistor LT1 and the second sensing transistor LT2 are P-type MOSFETs having a channel formed of a polycrystalline semiconductor, for example, poly silicon or amorphous silicon, and the third sensing transistor LT3 is an N-type MOSFET having a channel formed of an oxide semiconductor, but the present disclosure is not limited thereto.

In FIG. 4, the first electrodes of the first sensing transistor LT1 and the second sensing transistor LT2 may be a source electrode, and the second electrodes thereof may be a drain electrode, but the present disclosure is not limited thereto. The first electrode of the third sensing transistor LT3 may be a drain electrode, and the second electrode thereof may be a source electrode, but the present disclosure is not limited thereto.

Figure 5:
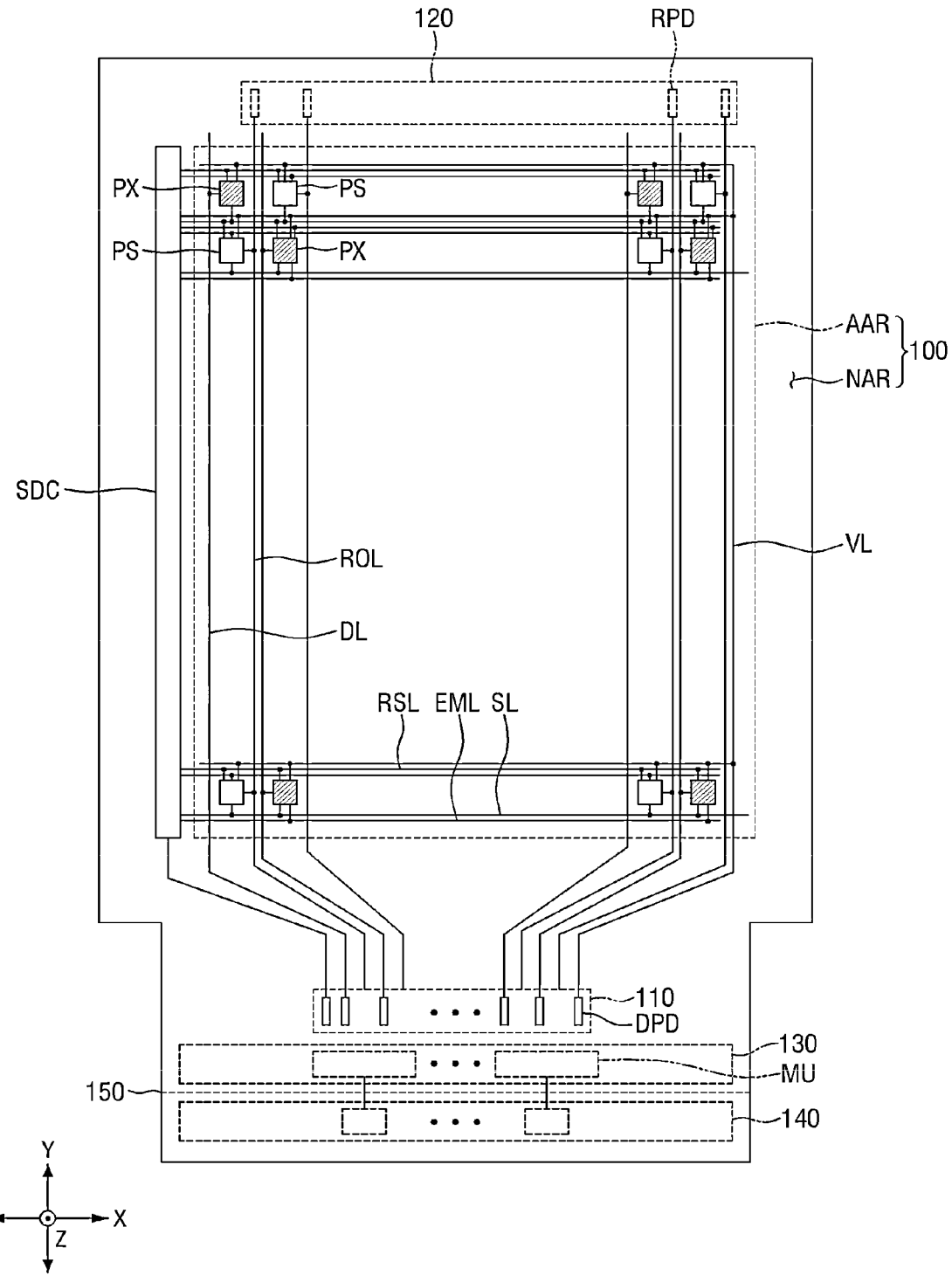
FIG. 5 is a schematic plan view of a display cell according to an exemplary embodiment.

FIG. 5 is a schematic plan view of a display cell according to an exemplary embodiment.

The active region AAR of the display cell 100 may include scan lines SL and power voltage lines VL connected to the plurality of pixels PX and the plurality of light sensors PS, light emitting control lines EML and data lines DL connected to the plurality of pixels PX, and reset lines RSL and readout lines ROL connected to the plurality of optical sensors PS.

The scan lines SL may supply scan signals received from a scan driver SDC to the plurality of pixels PX and the plurality of optical sensors PS. The scan lines SL may extend in the first direction X and may be spaced apart from each other in the second direction Y.

The light emitting control line EML may supply light emitting control signals received from the scan driver SDC to the plurality of pixels PX. The light emitting control lines EML may extend in the first direction X and may be spaced apart from each other in the second direction Y.

The data lines DL may supply test data signals received from data pads DPD of a first fan-out unit 110 to the plurality of pixels PX. The data lines DL may extend in the second direction Y and may be spaced apart from each other in the first direction X.

The power voltage lines VL may supply power voltages received from the data pads DPD of the first fan-out unit 110 to the plurality of pixels PX and the plurality of optical sensors PS. Here, the power voltage may be at least one of a first power voltage ELVDD, a second power voltage ELVSS, a first initialization voltage VINT, and a second initialization voltage VAINT. The power voltage lines VL may extend in the first direction X in the active region AAR and may be connected to each other in the active region AAR or the non-active region NAR.

The reset lines RSL may supply reset signals received from the scan driver SDC to the plurality of optical sensors PS. The reset lines RSL may extend in the first direction X and may be spaced apart from each other in the second direction Y.

The readout lines ROL may supply test sensing signals generated by the optical sensors PS according to external light to sensing pads RPD of a second fan-out unit 120. The readout lines ROL may extend in the second direction Y and may be spaced apart from each other in the first direction X.

In the non-active region NAR, the scan driver SDC, the first fan-out unit 110, the second fan-out unit 120, a signal selection unit 130, a test pad unit 140, and a cutting portion 150 are disposed.

The scan driver SDC may be disposed in a region adjacent to an end of the scan line. For example, the scan driver SDC may be disposed on one side of the non-active region NAR in the first direction X. The scan driver SDC may sequentially supply a plurality of scan signals ('GWi' in FIG. 8) to the plurality of scan lines SL. The scan driver SDC may sequentially supply a plurality of light emitting control signals to the plurality of light emitting control lines EML. The scan driver SDC may sequentially supply a plurality of rest signals ('RSTi' in FIG. 8) to the plurality of reset lines RSL. According to another example, when the display cell 100 separately includes a light emitting control driver and/or a reset driver, the light emitting control signal or the reset signal may be supplied separately from the light emitting control driver and/or a reset driver, respectively.

The first fan-out unit 110 may be disposed in a region of the non-active region NAR adjacent to one end of the data line DL. For example, the first fan-out unit 110 may be disposed on one side of the non-active region NAR in the second direction Y. The first fan-out unit 110 may include a plurality of data pads DPD connected to a panel driving circuit ('20' of FIG. 13). Each of the plurality of data pads DPD may be connected to a corresponding data line DL.

The second fan-out unit 120 may be disposed in a region of the non-active region NAR adjacent to one end of the readout line ROL. For example, the second fan-out unit 120 may be disposed on the other side of the non-active region NAR which opposing the one side of the non-active region NAR in the second direction Y. The second fan-out unit 120 may include a plurality of sensing pads RPD connected to a readout circuit ('40' of FIG. 13). Each of the plurality of sensing pads RPD may be connected to a corresponding readout line ROL.

It is illustrated in an exemplary embodiment that the first fan-out unit 110 and the second fan-out unit 120 are disposed on one side and the other side of the non-active region NAR with respect to the active region AAR, but the present disclosure is not limited thereto. For example, the first fan-out unit 110 and the second fan-out unit 120 may be disposed on only one side of the non-active region NAR. As another example, when the panel driving circuit 20 and the readout circuit 40 are embedded in one integrated circuit, the first fan-out unit 110 and the second fan-out unit 120 may be formed as one fan-out unit.

The signal selection unit 130 may be disposed in the non-active region NAR adjacent to the first fan-out unit 110 or the second fan-out unit 120. In this specification, the signal selection unit 130 is illustrated as being disposed in the region adjacent to the first fan-out unit 110. In this case, the signal selection unit 130 may be disposed between the first fan-out unit 110 and the test pad unit 140. However, a location of the signal selection unit 130 is not limited thereto, and the signal selection unit 130 may be disposed adjacent to the second fan-out unit 120 between the second fan-out unit 120 and the test pad unit 140.

Figure 7:
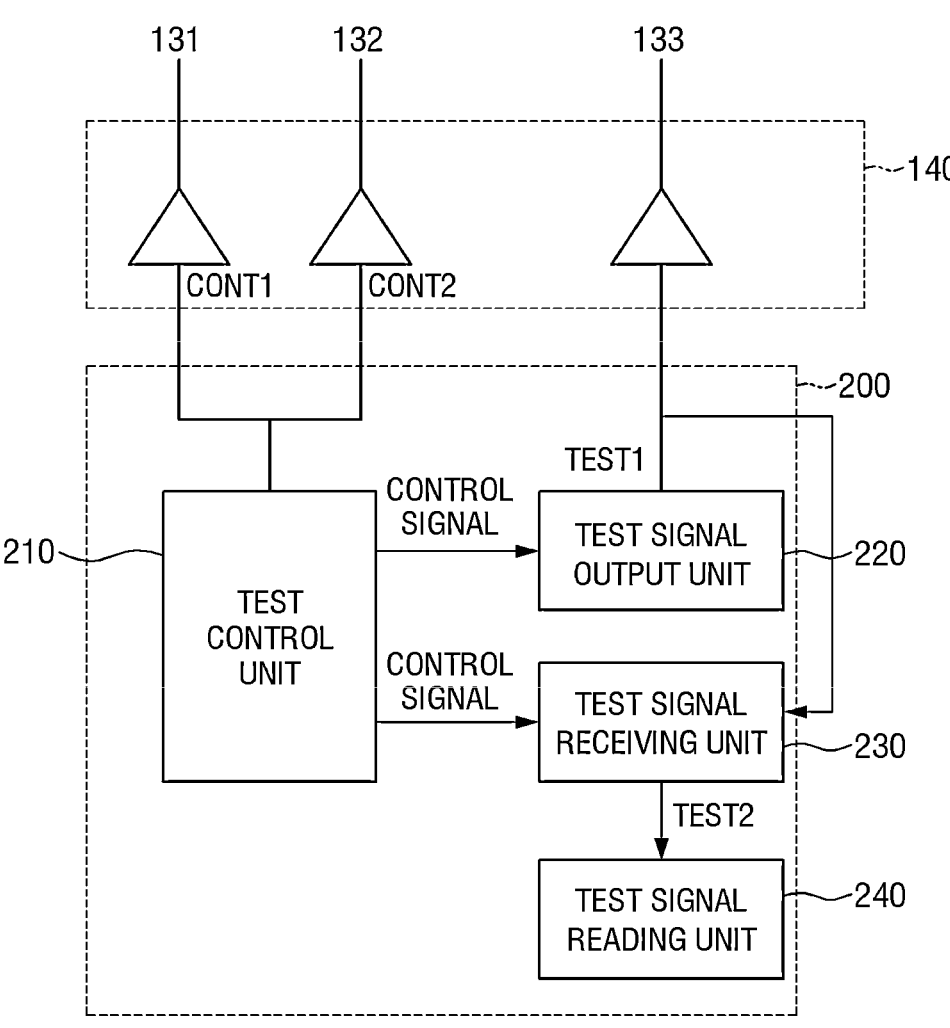
FIG. 7 is a conceptual view of a test member according to an exemplary embodiment.

The signal selection unit 130 may be selectively connected to any one of the data line DL and the readout line ROL in response to the test control signal provided from the test member ('200' in FIG. 7). For example, the signal selection unit 130 may be connected to the data line DL in a data test mode of the test member 200, and may be connected to the readout line ROL in a sensing test mode of the test member 200. When the signal selection unit 130 is connected to the data line DL, the signal selection unit 130 may transmit the test data signal provided from the test member 200 to the data line DL. When the signal selection unit 130 is connected to the readout line ROL, the signal selection unit 130 may transmit the test sensing signal output from the readout line ROL to the test member 200.

The signal selection unit 130 may include a plurality of multiplexers MU. One multiplexer MU may be connected to a plurality of data lines DL and the plurality of readout lines ROL. The one multiplexer MU may select one of the signals from the plurality of data lines DL and the plurality of readout lines ROL, and transmit the selected signal to one test pad included in the test pad unit 140. For example, when the multiplexer MU is connected to the data line DL, the multiplexer MU may select one of the test data signals of the four data lines DL and transmit the selected signal to the test pad unit 140. As another example, when the multiplexer MU is connected to the readout line ROL, the multiplexer MU may select one of the test sensing signals from the four readout lines ROL and transmit the selected signal to the test pad unit 140.

The test pad unit 140 may be disposed on one side of the signal selection unit 130 to be connected to the signal selection unit 130. The test pad unit 140 may receive the test control signal, the test data signal, and the test sensing signal provided from the test member 200. The test signals may be provided to the signal selection unit 130 through the test pad unit 140.

The cutting portion 150 is a region cut through the cutting process before the module process. The cutting portion 150 may be disposed between the test pad unit 140 and the signal selection unit 130, and the test pad unit 140 and the signal selection unit 130 may be separated through the cutting process.

Figure 6:
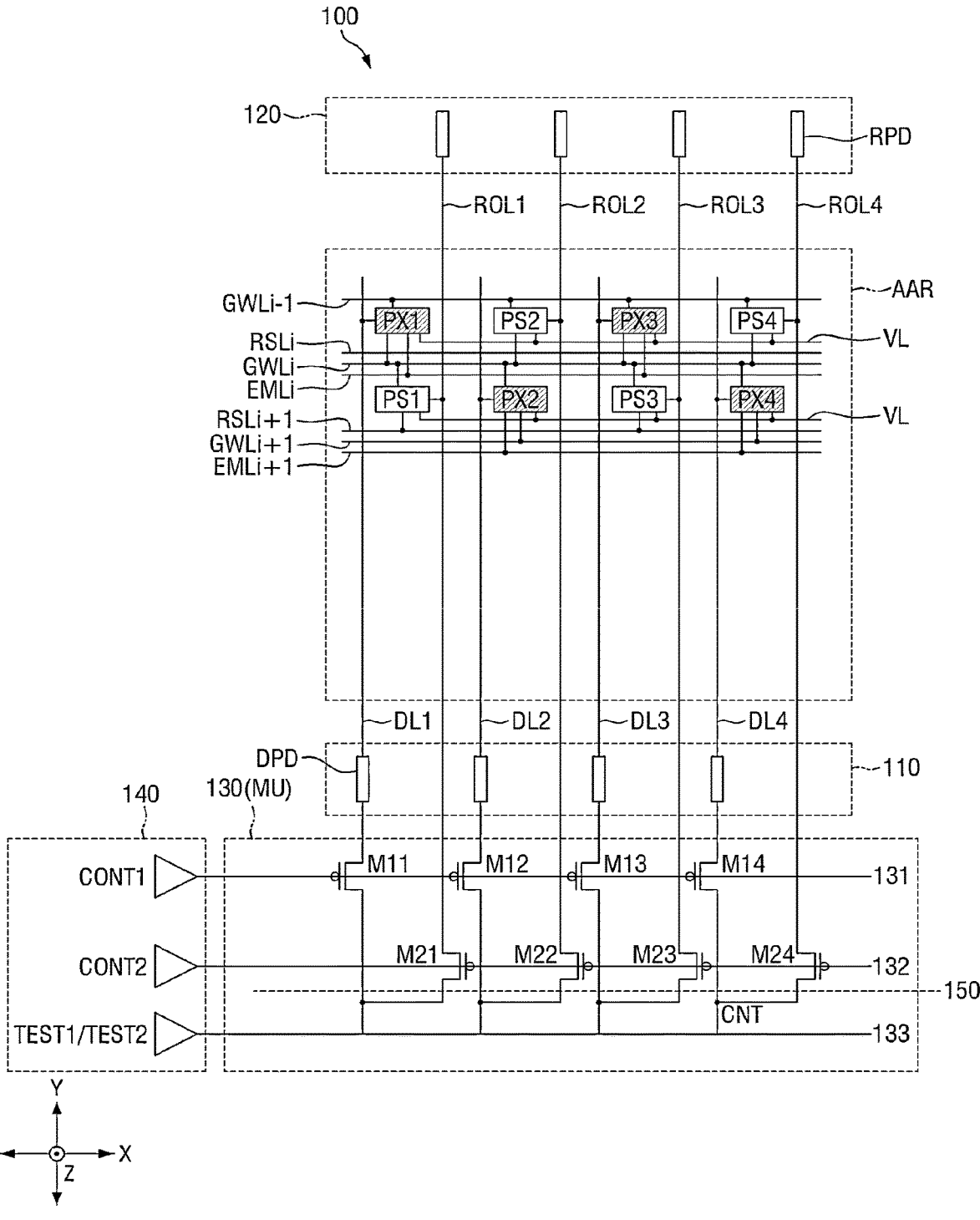
FIG. 6 is a conceptual view of a display cell according to an exemplary embodiment.

FIG. 6 is a conceptual view of a display cell according to an exemplary embodiment and FIG. 7 is a conceptual view of a test member according to an exemplary embodiment.

Referring to FIG. 6, the display driver of the first pixel PX1, the second pixel PX2, the third pixel PX3, and the fourth pixel PX4 and the sensing driver of the optical sensors PS (PS1, PS2, PS3, and PS4) may be arranged in the active region AAR. An arrangement relationship of the display driver of the first pixel PX1, the second pixel PX2, the third pixel PX3, and the fourth pixel PX4 and the sensing driver of the optical sensors PS may be substantially the same as the arrangement relationship between the light emitting region and the light sensing region of FIG. 2. The optical sensors PS may include a first optical sensor PS1, a second optical sensor PS2, a third optical sensor PS3, a fourth optical sensor PS4 which are connected to the readout lines ROL1, ROL2, ROL3, and ROL4, respectively.

The first pixel PX1 may be connected to the i−1-th scan line GWLi−1, the i-th scan line GWLi, the i-th light emitting control line EMLi, the power voltage line VL, and a first data line DL1.

The second pixel PX2 may be connected to the i-th scan line GWLi, the i+th scan line GWLi+1, an i+1-th light emitting control line EMLi+1, the power voltage line VL, and a second data line DL2.

The third pixel PX3 may be connected to the i−1-th scan line GWLi−1, the i-th scan line GWLi, the i-th light emitting control line EMLi, the power voltage line VL, and a third data line DL3.

The fourth pixel PX4 may be connected to the i-th scan line GWLi, the i+th scan line GWLi+1, the i+1-th light emitting control line EMLi+1, the power voltage line VL, and a fourth data line DL4.

The first optical sensor PS1 may be connected to the i-th scan line GWLi, an i+1-th reset line RSLi+1, the power voltage line VL, and the first readout line ROL1

The second optical sensor PS2 may be connected to the i−1-th scan line GWLi−1, the i-th reset line RSLi, the power voltage line VL, and the second readout line ROL2.

The third optical sensor PS3 may be connected to the i-th scan line GWLi, the i+1-th reset line RSLi+1, the power voltage line VL, and the third readout line ROL3.

The fourth optical sensor PS4 may be connected to the i−1-th scan line GWLi−1, the i-th reset line RSLi, the power voltage line VL, and the fourth readout line ROL4.

The plurality of data pads DPD of the first fan-out unit 110 may be connected to the plurality of data lines DL1, DL2, DL3, and DL4, respectively.

The plurality of sensing pads RPD of the second fan-out unit 120 may be connected to the plurality of readout lines ROL1, ROL2, ROL3, and ROL4, respectively.

The signal selection unit 130 may include a plurality of multiplexers MU. Each of the plurality of multiplexers MU may be connected to the plurality of data lines DL1, DL2, DL3, and DL4 and the plurality of readout lines ROL1, ROL2, ROL3, and ROL4. In the present specification, each of the plurality of multiplexers MU is illustrated as being connected to four data lines and four readout lines, but the number of signal lines is not limited thereto.

Each of the plurality of multiplexers MU includes a plurality of switching transistors, a first test control line 131, a second test control line 132, and a test signal line 133.

The plurality of switching transistors may include first switching transistors M11, M12, M13, and M14 controlled by a first test control signal CONT1 of the first test control line 131, and second switching transistors M21, M22, M23, and M24 controlled by a second test control signal CONT2 of the second test control line 132.

The first switching transistors M11, M12, M13, and M14 may be turned on according to the first test control signal CONT1 of the first test control line 131 to connect the test signal line 133 to the data lines DL1, DL2, DL3, and DL4. Gate electrodes of the first switching transistors M11, M12, M13, and M14 may be connected to the first test control line 131, first electrodes thereof may be connected to the test signal line 133 and first electrodes of the second switching transistors M21, M22, M23, and M24, and second electrodes thereof may be connected to the data lines DL1, DL2, DL3, and DL4 connected to the data pads DPD.

The second switching transistors M21, M22, M23, and M24 may be turned on according to the second test control signal CONT2 to connect the test signal line 133 to the readout lines ROL1, ROL2, ROL3, and ROL4. Gate electrodes of the second switching transistors M21, M22, M23, and M24 may be connected to the second test control line 132, the first electrodes thereof may be connected to the test signal line 133 and the first electrodes of the first switching transistors M11, M12, M13, and M14, and second electrodes thereof may be connected to the readout lines ROL1, ROL2, ROL3, and ROL4 connected to the sensing pads RPD.

The first electrodes of the first switching transistor M11, M12, M13, and M14 may be disposed on a different conductive layer than the first electrodes of the second switching transistor M21, M22, M23, and M24, and may be connected to the first electrodes of the second switching transistors M21, M22, M23, and M24 through a contact hole. Accordingly, the first electrodes of the first switching transistors M11, M12, M13, and M14 may be electrically connected to the first electrodes of the second switching transistors M21, M22, M23, and M24. For example, according to an exemplary embodiment, when the first thin film transistor TFT1 and the second thin film transistor TFT2 include a first gate layer and a second gate layer on the semiconductor layers A1 and A2, the first electrodes of the first switching transistors M11, M12, M13, and M14 may be disposed on the first gate layer, and the first electrodes of the second switching transistors M21, M22, M23, and M24 may be disposed on the second gate layer. The first gate layer may include the gate electrode G1 of the first thin film transistor TFT1, and the second gate layer may include the other electrode of the first capacitor Cst.

The first test control line 131 may turn on the first switching transistors M11, M12, M13, and M14 in response to the first test control signal CONT1 received from the test pad unit 140. The second test control line 132 may turn on the second switching transistors M21, M22, M23, and M24 in response to the second test control signal CONT2 received from the test pad unit 140.

The test signal line 133 may transmit a test signal TEST1 or TEST2 to the plurality of data lines DL1, DL2, DL3, and DL4 connected to the first to fourth pixels PX1, PX2, PX3, and PX4. The test signal may be a test data signal TEST1 for the data test mode. In addition, the test signal line 133 may transmit a test signal TEST1 or TEST2 to the plurality of readout lines ROL1, ROL2, ROL3, and ROL4 connected to the first to fourth optical sensors PS1, PS2, PS3, and PS4. The test signal may be a test sensing signal TEST2 for the sensing test mode.

The test signal line 133 may be simultaneously connected to the first electrodes of the first switching transistors M11, M12, M13, and M14 and the first electrodes of the second switching transistors M21, M22, M23, and M24. Since the first switching transistors M11, M12, M13, and M14 and the second switching transistors M21, M22, M23, and M24 are not turned on at the same time, different signals may be transmitted to the first electrodes of the first switching transistors M11, M12, M13, and M14 and the first electrodes of the second switching transistors M21, M22, M23, and M24 even when one test signal line 133 is used.

For example, when the first test control signal CONT1 is applied to the first test control line 131 during the data test mode, the first switching transistors M11, M12, M13, and M14 may be turned on and the second switching transistors M21, M22, M23, and M24 may be turned off. In this case, the test data signal TEST1 applied to the test signal line 133 may be applied to the first to fourth pixels PX1, PX2, PX3, and PX4 through the plurality of data lines DL1, DL2, DL3, and DL4.

As another example, when the second test control signal CONT2 is applied to the second test control line 132 during the sensing test mode, the first switching transistors M11, M12, M13, and M14 may be turned off, and the second switching transistors M21, M22, M23, and M24 may be turned on. In this case, the test sensing signal TEST2 generated from the first to fourth optical sensors PS1, PS2, PS3, and PS4 may be transmitted to the test signal line 133 through the plurality of readout lines ROL1, ROL2, ROL3, and ROL4.

The test pad unit 140 includes pads connected to the test member 200. The test pad unit 140 is connected to a test control unit 210 to receive the first test control signal CONT1 and the second test control signal CONT2. In addition, the test pad unit 140 is connected to a test signal output unit 220 or a test signal receiving unit 230 to receive the test data signal TEST1 or the test sensing signal TEST2.

The cutting portion 150 may be disposed between the first electrodes of the first switching transistors M11, M12, M13, and M14 and the test signal line 133, and may be disposed between the first electrodes of the second switching transistors M21, M22, M23, and M24 and the test signal line 133.

Figure 11:
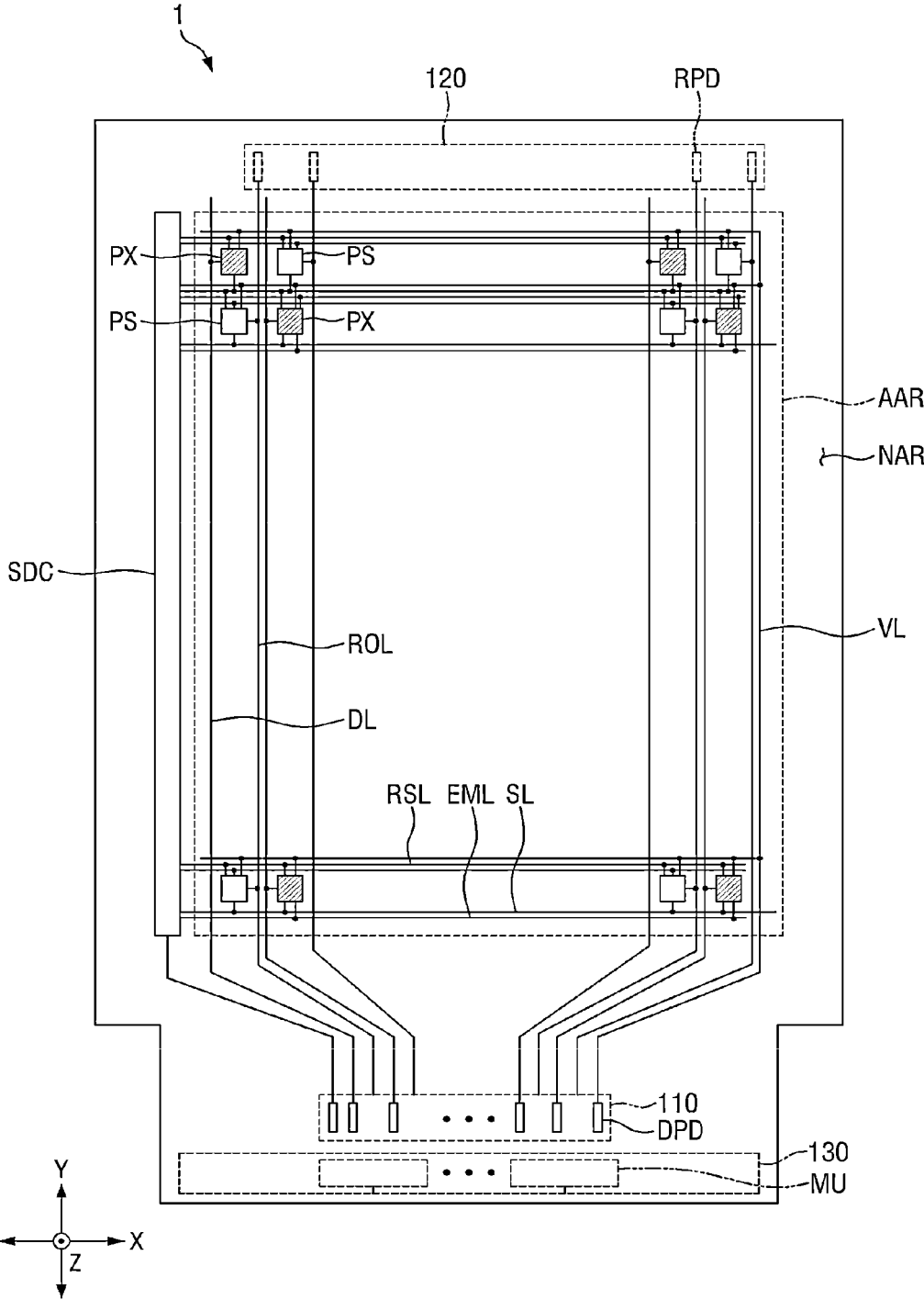
FIG. 11 is a schematic plan view of a display device after a module process illustrated in FIG. 10.
Figure 12:
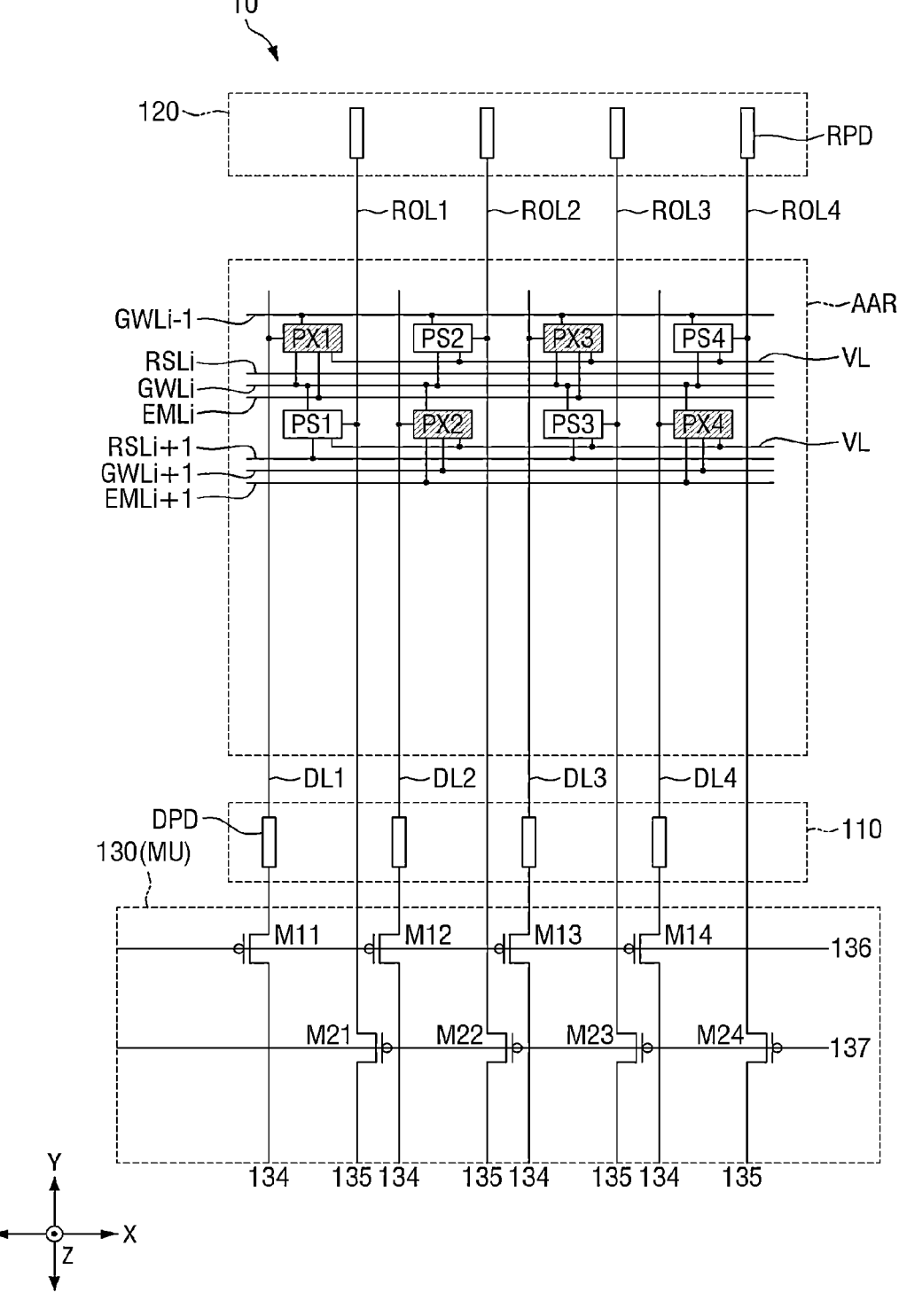
FIG. 12 is a conceptual view of the display device according to FIG. 11.

The cutting portion 150 may separate the first electrodes of the first switching transistors M11, M12, M13, and M14, the first electrodes of the second switching transistors M21, M22, M23, and M24, and the test signal line 133 during a cutting process. In this case, the first electrodes of the first switching transistors M11, M12, M13, and M14 and the first electrodes of the second switching transistors M21, M22, M23, and M24 may be electrically floated through which no signal is applied. This will be described with reference to FIGS. 11 and 12 illustrating after the module process.

The test member 200 may include a test control unit 210, a test signal output unit 220, a test signal receiving unit 230, and a test signal reading unit 240.

The test control unit 210 may output a plurality of test control signals corresponding to a plurality of test modes. For example, the test control unit 210 may output the first test control signal CONT1 during the data test mode and may provide the first test control signal CONT1 to the first test control line 131 connected to the test pad unit 140. The test control unit 210 may output the second test control signal CONT2 during the sensing test mode and may provide the second test control signal CONT2 to the second test control line 132 connected to the test pad unit 140. The test control unit 210 may also output control signals for controlling the test signal output unit 220 and the test signal receiving unit 230 according to the plurality of test modes.

The test signal output unit 220 may output the test data signal TEST1 to the test signal line 133 in response to the control signal of the test control unit 210. For example, the test data signal TEST1 of the test signal output unit 220 may be a direct current (DC) data voltage. When the first test control signal CONT1 is applied to the first test control line 131 according to the data test mode, the test data signal TEST1 may be transmitted to the data lines DL1, DL2, DL3, and DL4 through the first switching transistors M11, M12, M13, and M14. In this case, it may be tested whether or not each of the pixels PX1, PX2, PX3, and PX4 emits light of a predetermined grayscale according to the test data signal TEST1. For example, it may be tested whether or not a bright spot or a dark spot displaying a grayscale higher or lower than a data voltage applied to each of the pixels PX1, PX2, PX3, and PX4 is generated.

The test signal receiving unit 230 may receive the test sensing signal TEST2 through the test signal line 133 in response to the control signal of the test control unit 210. For example, the test sensing signal TEST2 received by the test signal receiving unit 230 may be a sensing current or a sensing voltage generated from the optical sensor PS. When the second test control signal CONT2 is applied to the second test control line 132 during the sensing test mode, the test sensing signal TEST2 from the readout lines ROL1, ROL2, ROL3, and ROL4 may be transmitted to the test signal line 133 through the second switching transistors M21, M22, M23, and M24. The test signal receiving unit 230 may transmit the received test sensing signal TEST2 to the test signal reading unit 240.

The test signal reading unit 240 may read the test sensing signal TEST2 provided from the test signal receiving unit 230. The test signal reading unit 240 includes a readout circuit and the readout circuit may decide whether or not the optical sensor PS normally operates using the test sensing signal TEST2.

Figure 8:
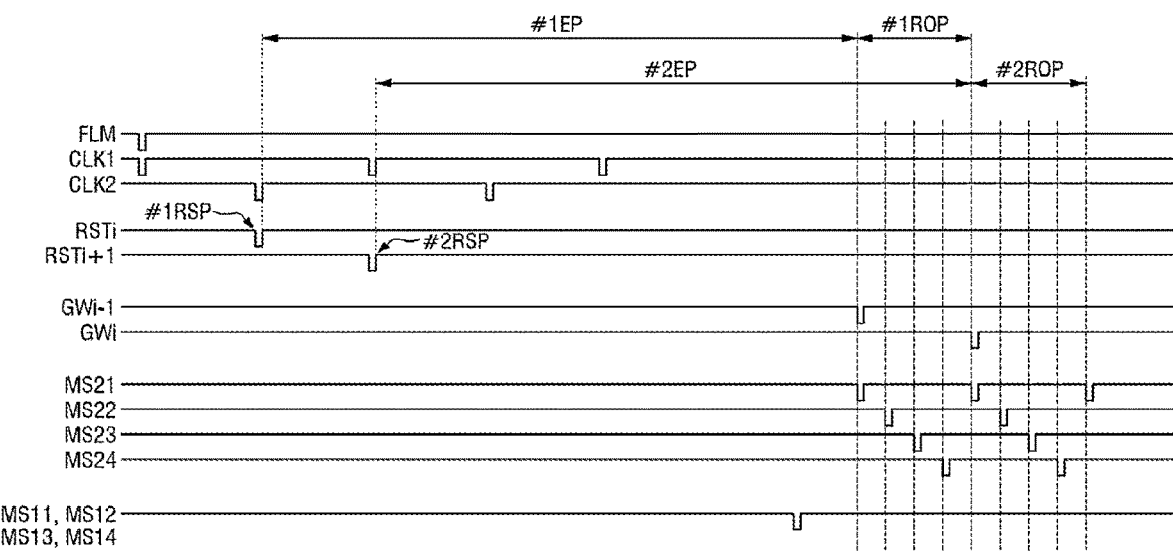
FIG. 8 is a waveform diagram of control signals for describing a data test method and a sensing test method of a display cell according to an exemplary embodiment.

FIG. 8 is a waveform diagram of control signals for describing a data test method and a sensing test method of a display cell according to an exemplary embodiment.

Referring to FIG. 8 together with FIGS. 4 and 6, a frame start signal FLM is a signal output from the test control unit

210 and one frame period for driving the optical sensor PS may be started according to the frame start signal FLM. A first clock signal CLK1 and a second clock signal CLK2 are signals output from the test control unit 210 and may determine turn-on periods of reset signals RSTi and RSTi+1 and scan signals GWi−1, GWi, and GWi+1.

FIG. 8 illustrates a waveform diagram of the i-th reset signal RSTi and the i−1-th scan signal GWi−1 applied to the second optical sensor PS2 and the fourth optical sensor PS4, and the i+1-th reset signal RSTi+1 and the i-th scan signal GWi applied to the first optical sensor PS1 and the third optical sensor PS3. The reset signals RSTi and RSTi+1 are signals applied to the reset lines RSLi and RSLi+1, and are signals for controlling turn-on and turn-off of the third sensing transistor LT3 of the optical sensor PS. The scan signals GWi−1 and GWi are signals applied to the scan lines GWLi−1 and GWLi, and are signals for controlling the second sensing transistor LT2 of the optical sensor PS.

First switching signals MS11, MS12, MS13, and MS14 are the first test control signals CONT1 applied to the first test control line 131, and are signals for controlling the first switching transistors M11, M12, M13, and M14. Second switching signals MS21, MS22, MS23, and MS24 are the second test control signals CONT2 applied to the second test control line 132, and are signals for controlling the second switching transistors M21, M22, M23, and M24.

First, a process of testing the optical sensors PS of the display cell 100 during the sensing test mode of the test member 200 will be described.

The i-th reset signal RSTi and the i−1-th scan signal GWi−1 may be activated once in one frame period, and the i+1-th reset signal RSTi+1 and the i-th scan signal GWi may be activated once in one frame period.

One frame period of the optical sensor PS driven according to the frame start signal FLM, the first clock signal CLK1, and the second clock signal CLK2 of the test control unit 210 may include a reset period RSP, a light exposure period EP, and a fingerprint reading period ROP. An i-th frame period according to the i-th reset signal RSTi and the i−1-th scan signal GWi−1 has a first reset period #1RSP, a first light exposure period #1EP, and a first fingerprint reading period #1ROP, and an i+1-th frame period according to the i+1-th reset signal RSTi+1 and the i-th scan signal GWi has a second reset period #2RSP, a second light exposure period #2EP, and a second fingerprint reading period #2ROP.

The reset signals RSTi and RSTi+1 may have a gate low voltage during the reset period RSP and a gate high voltage during the remaining periods. The scan signals GWi−1 and GWi may have a gate low voltage during the fingerprint reading period ROP and a gate high voltage during the remaining periods.

During the reset period RSP, the sensing anode electrode of the photoelectric conversion element PD may be reset to the reset voltage Vrst. During the reset period RSP, the reset signals RSTi and RSTi+1 having a gate low voltage are supplied to the reset lines RSLi and RSLi+1. Accordingly, the third sensing transistor LT3 is turned on, and the first node N1 and the sensing anode electrode of the photoelectric conversion element PD are reset to the reset voltage Vrst which is lower than the common voltage ELVSS. Accordingly, the photoelectric conversion element PD may maintain a reverse bias state.

Thereafter, during the light exposure period EP, the photoelectric conversion element PD is exposed to external light, photo-charges are generated according to an intensity of the external light, and accordingly, a voltage of the sensing anode electrode of the photoelectric conversion element PD and a voltage of the first node N1 may increase. The photoelectric conversion element PD may generate photo-charges corresponding to light reflected by the ridges ('RID' in FIG. 3) of the fingerprint or the valleys ('VAL' in FIG. 3) between the ridges RID, and may generate a reverse photocurrent in proportion to the amount of generated photo-charges. Accordingly, the voltage of the first node N1 may increase until a voltage difference between the first electrode and the gate electrode of the first sensing transistor LT1 (Vgs) reaches an absolute value of the threshold voltage Vth. When the first node N1 reaches the threshold voltage Vth of the first sensing transistor LT1, the first sensing transistor LT1 may be turned on and the first sensing transistor LT1 may generate a sensing current Irx according to the voltage of the first node N1.

Then, during the fingerprint reading period ROP, the second sensing transistor LT2 may be turned on to read the fingerprint according to the magnitude of the sensing current Irx flowing through the readout line ROL. During the fingerprint reading period ROP, the scan signals GWi−1 and GWi having a gate low voltage are supplied to the scan lines GWLi−1 and GWLi. Accordingly, the second sensing transistor LT2 may be turned on and the sensing current Irx of the first sensing transistor LT1 may be output to the readout line ROL through the second sensing transistor LT2. The sensing current Irx is a source-drain current generated in proportion to the voltage of the first node N1 input to the gate electrode of the first sensing transistor LT1. The sensing current Irx is transmitted to the test signal line 133 through the readout line ROL when the second switching transistors M21, M22, M23, and M24 are turned on. In this case, the sensing current Irx may be the test sensing signal TEST2. Since a voltage change of the first node N1 is different depending on the ridge RID or the valley VAL of the fingerprint, the test sensing signal TEST2 may be read through the change amount of the sensing current Irx.

Meanwhile, during the fingerprint reading period ROP, the second switching transistors M21, M22, M23, and M24 connecting the readout lines ROL1, ROL2, ROL3, and ROL4 and the test signal line 133 may be sequentially turned on. That is, the second switching signals MS21, MS22, MS23, and MS24 having a gate low voltage are sequentially supplied to the second test control line 132 during the fingerprint reading period ROP. Accordingly, a first sub-transistor M21, a second sub-transistor M22, a third sub-transistor M23, and a fourth sub-transistor M24 included in the second switching transistors may be sequentially turned on. For example, the test sensing signal TEST2 of the first optical sensor PS1 connected to the first readout line ROL1 is output to the test signal line 133 through the first sub-transistor M21, the test sensing signal TEST2 of the second optical sensor PS2 connected to the second readout line ROL2 is output to the test signal line 133 through the second sub-transistor M22, the test sensing signal TEST2 of the third optical sensor PS3 connected to the third readout line ROL3 is output to the test signal line 133 through the third sub-transistor M23, and the test sensing signal TEST2 of the fourth optical sensor PS4 connected to the fourth readout line ROL4 is output to the test signal line 133 through the fourth sub-transistor M24.

Accordingly, the test system may individually determine whether or not the plurality of optical sensors PS normally operate. That is, even if the first to fourth optical sensors PS1, PS2, PS3, and PS4 are applied with the same signal at the same timing, it is possible to individually determine whether or not the first to fourth optical sensors PS1, PS2, PS3, and PS4 normally operate by sequentially connecting the readout lines ROL1, ROL2, ROL3, and ROL4 to the test signal line 133. For example, even if the first optical sensor PS1 and the third optical sensor PS3 are applied with the i-th scan signal GWi and the i+1-th reset signal RSTi+1 that are the same as each other and pass through the first reset period #1RSP, the first light exposure period #1EP, and the first fingerprint reading period #1ROP, a period in which the first optical sensor PS1 is connected to the first readout line ROL1 and a period in which the third optical sensor PS3 is connected to the third readout line ROL3 within the first fingerprint reading period #1ROP are different from each other. Accordingly, it is possible to read whether or not each of the first optical sensor PS1 and the third optical sensor PS3 normally operates.

Next, a process of testing the display cell 100 during the data test mode of the test member 200 will be described.

One frame cycle of the pixel PX may start in response to the frame start signal FLM, the first clock signal CLK1, and the second clock signal CLK2 of the test control unit 210. Meanwhile, the data test mode of the test control unit 210 may be performed independently of the sensing test mode.

The first switching transistors M11, M12, M13, and M14 connecting the data lines DL1, DL2, DL3, and DL4 and the test signal line 133 to each other may be simultaneously turned on during the data test mode. That is, the first switching signals MS11, MS12, MS13, and MS14 having a gate low voltage are simultaneously supplied to the first test control line 131. Accordingly, the first switching transistors M11, M12, M13, and M14 may be turned on at the same time.

Accordingly, the test system may simultaneously determine whether or not the plurality of pixels PX normally operate. That is, as the first to fourth data lines DL1, DL2, DL3, and DL4 connected to the first to fourth pixels PX1, PX2, PX3, and PX4 are simultaneously connected to the test signal line 133, it may be tested whether or not each of the pixels emits light of a predetermined grayscale.

Meanwhile, in the present exemplary embodiment, in the sensing test mode of the display cell 100, the optical sensor PS may generate a photocurrent according to an external light. That is, since sensing test is performed before the light emitting element EL is ready to emit light, the sensing test mode of the display cell 100 may be performed under a condition in which the optical sensor PS is exposed to external light.

Hereinafter, a test method according to test modes will be described with reference to FIG. 9 together with FIGS. 6 and 7. FIG. 9 is a flowchart for describing a data test method and a sensing test method of a display cell according to an exemplary embodiment.

In an exemplary embodiment, since the data test mode and the sensing test mode proceed independently of each other, whether or not the pixel PX and the optical sensor PS normally operate may be determined according to each of the test modes even if the test signal line 133 applying the test data signal TEST1 to the data line DL is the same as the test signal line 133 receives the test sensing signal TEST2 from the readout line ROL.

First, the test control unit 210 outputs the first test control signal CONT1 during the data test mode (S110). When the first test control signal CONT1 is applied to the first test control line 131, the first switching transistors M11, M12, M13, and M14 are turned on and the second switching transistors M21, M22, M23, and M24 are turned off (S120). Accordingly, each of the plurality of data lines DL1, DL2, DL3, and DL4 may be connected to the test signal line 133 through the first switching transistors M11, M12, M13, and M14. The test signal output unit 220 outputs the test data signal TEST1 to the test signal line 133 (S130). The test data signal TEST1 may be a DC data voltage. The plurality of data lines DL1, DL2, DL3, and DL4 transmit the test data signal TEST1 to each of the plurality of pixels PX1, PX2, PX3, and PX4 (S140). It is tested whether or not the pixels PX1, PX2, PX3, and PX4 normally operate according to the test data signal TEST1 (S150). For example, it may be tested whether or not each of the pixels PX1, PX2, PX3, and PX4 emits light of a predetermined grayscale according to the test data signal TEST1. It may be tested whether or not a bright spot or a dark spot is generated in the pixel PX by classifying pixels displaying a grayscale higher or lower than the test data signal TEST1.

The test control unit 210 outputs the second test control signal CONT2 during the sensing test mode (S210). When the second test control signal CONT2 is applied to the second test control line 132, the second switching transistors M21, M22, M23, and M24 are turned on, and the first switching transistors M11, M12, M13, and M14 are turned off (S220). Accordingly, each of the plurality of readout lines ROL1, ROL2, ROL3, and ROL4 may be connected to the test signal line 133 through the second switching transistors M21, M22, M23, and M24. Each of the plurality of readout lines ROL1, ROL2, ROL3, and ROL4 transmits the test sensing signal TEST2 generated from the optical sensors PS1, PS2, PS3, and PS4 to the test signal line 133 (S230). The test signal receiving unit 230 receives the test sensing signal TEST2 applied from the test signal line 133 (S240). The test signal reading unit 240 reads the test sensing signal TEST2 to test whether or not the optical sensors PS1, PS2, PS3, and PS4 normally operate (S250). Since each of the second switching transistors M21, M22, M23, and M24 is sequentially turned on, whether or not the optical sensors PS1, PS2, PS3, and PS4 normally operate may be individually tested.

Figure 10:
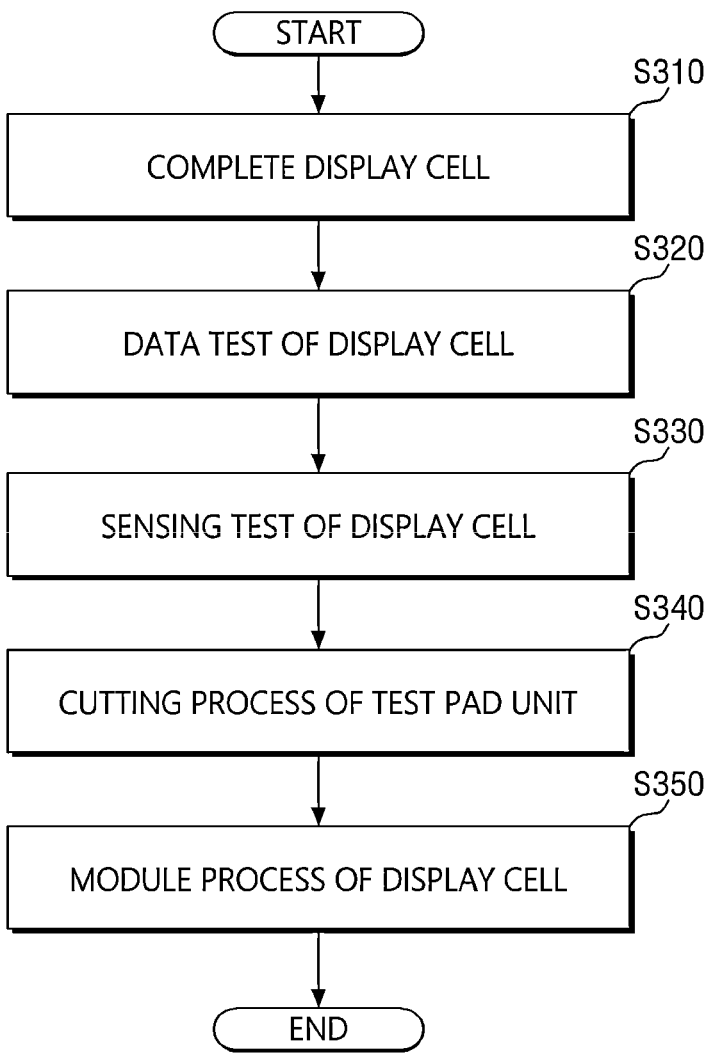
FIG. 10 is a flowchart for describing a method of manufacturing a display device according to an exemplary embodiment of the present disclosure.

FIG. 10 is a flowchart for describing a method of manufacturing a display device according to an exemplary embodiment of the present disclosure.

Referring to FIG. 10 together with FIGS. 5 to 7, when a manufacturing the display cell 100 is completed (S310), a test process of the display cell 100 is performed through the test member 200. For example, a data test process of the display cell 100 is performed (S320). For the data test process, the test member 200 applies the first test control signal CONT1 and the test data signal TEST1 to the test pad unit 140 of the display cell 100. In this case, the test member 200 does not output the second test control signal CONT2. Electrical defects of the plurality of data lines DL1, DL2, DL3, and DL4 connected to the plurality of pixels PX are tested through the data test process.

As another example, a sensing test process of the display cell 100 is performed (S330). The sensing test process may be performed independently of the data test process. For the sensing test process, the test member 200 applies the second test control signal CONT2 to the test pad unit 140 of the display cell 100, and receives the test sensing signal TEST2 through the test pad unit 140. In this case, the test member 200 does not output the first test control signal CONT1. Electrical defects of the plurality of readout lines ROL1, ROL2, ROL3, and ROL4 connected to the plurality of optical sensors PS are tested through the sensing test process.

As described above, both the data test and the sensing test may be performed in the state of the display cell 100. After performing both the data test and the sensing test, a cutting process of electrically or physically separating the signal selection unit 130 and the test pad unit 140 along the cutting portion 150 of the display cell 100 is performed (S340).

Figure 13:
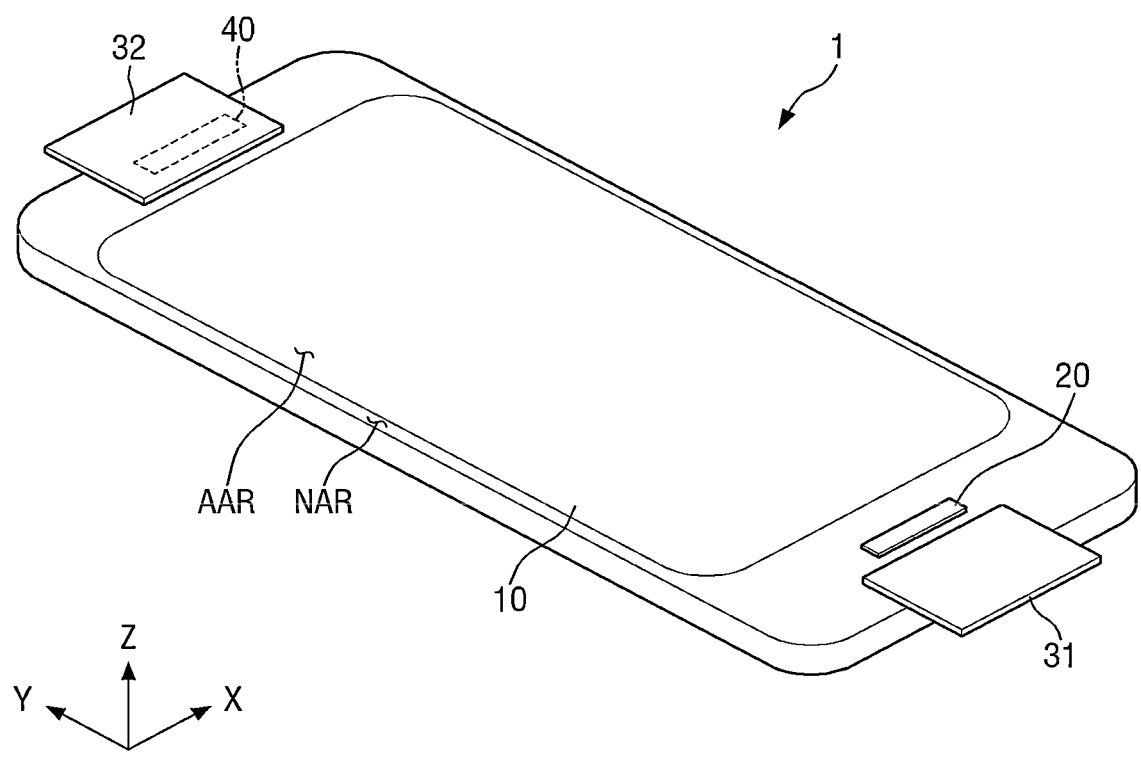
FIG. 13 is a perspective view illustrating the display device after the module process according to an exemplary embodiment.

Referring to FIG. 13, after the cutting process, a module process of attaching at least one panel driving circuit 20, circuit boards 31 and 32, and a readout circuit 40 to the display panel 10 is performed (S350).

According to the present exemplary embodiment, since the electrical defects of the data lines and the readout lines may be tested using the data test and the sensing test in the state of the display cell, a yield of the module process may be improved, and manufacturing costs may be reduced.

Hereinafter, a display device 1 formed after the process of cutting the display cell 100 along the cutting portion 150 according to an exemplary embodiment will be described. FIG. 11 is a schematic plan view of a display device after a module process illustrated in FIG. 10, and FIG. 12 is a conceptual view of the display device according to FIG. 11.

Referring to FIGS. 11 and 12, the first test control line ('131' in FIG. 6), the second test control line ('132' in FIG. 6), and the test signal line ('133' in FIG. 6) of the signal selection unit 130 may be a plurality of floating lines 134, 135, 136, and 137 to which signals are not applied after being cut along the cutting portion 150.

The plurality of floating lines 134, 135, 136, and 137 include a first floating line 134, a second floating line 135, a third floating line 136, and a fourth floating line 137.

The first floating line 134 may be disposed on one side of the display device 1 in the second direction Y. The first floating line 134 may be connected to the first electrodes of the first switching transistors M11, M12, M13, and M14. The first floating line 134 may be the test signal line 133 that transmits the test data signal to the data lines DL1, DL2, DL3, and DL4 before the cutting process.

The second floating line 135 may be disposed on the one side of the display device 1 in the second direction Y. The second floating line 135 may be connected to the first electrodes of the second switching transistors M21, M22, M23, and M24. The second floating line 135 may be the test signal line 133 that transmits the test sensing signal from the readout lines ROL1, ROL2, ROL3, and ROL4 before the cutting process.

The third floating line 136 may be connected to the gate electrodes of the first switching transistors M11, M12, M13, and M14. The third floating line 136 may be the first test control line 131 that transmits the first test control signal to the gate electrodes of the first switching transistors M11, M12, M13, and M14 before the cutting process.

The fourth floating line 137 may be connected to the gate electrodes of the second switching transistors M21, M22, M23, and M24. The fourth floating line 137 may be the second test control line 132 that transmits the second test control signal to the gate electrodes of the second switching transistors M21, M22, M23, and M24 before the cutting process.

The floating lines 134, 135, 136, and 137 according to the present exemplary embodiment are not limited to the above examples. For example, the third floating line 136 and the fourth floating line 137 may be signal lines controlled by the timing control unit after the module process. When the third floating line 136 and the fourth floating line 137 are connected to a gate low voltage line, the first switching transistor and the second switching transistor may be turned on for one frame period. In this case, the first floating line 134 may be a signal line to which the same signal as the data lines DL1, DL2, DL3, and DL4 is applied, and the second floating line 135 may be a signal line to which the same signal as the readout lines ROL1, ROL2, ROL3, and ROL4 is applied.

Hereinafter, the display device 1 after the module process according to an exemplary embodiment will be described. FIG. 13 is a perspective view illustrating the display device after the module process according to an exemplary embodiment.

Referring to FIG. 13, the display device 1 after the module process may include a display panel 10, a panel driving circuit 20, a first circuit board 31, a second circuit board 32, and a readout circuit 40.

The display panel 10 corresponds to the display cell 100 before the module process. Accordingly, the display panel 10 may include the plurality of pixels PX and the plurality of optical sensors PS disposed in the active region AAR.

The panel driving circuit 20 may be disposed in the non-active region NAR. The panel driving circuit 20 may output signals and voltages for driving the plurality of pixels PX and/or the plurality of optical sensors PS. The panel driving circuit 20 may be formed as an integrated circuit (IC) and attached onto the non-active region NAR of the display panel 10. As another example, the panel driving circuit 20 may be mounted on the first circuit board 31.

The readout circuit 40 may be disposed in the non-active region NAR. The readout circuit 40 may be connected to each of the optical sensors PS through a readout line, and may receive a current flowing through each of the optical sensors PS to sense a user's fingerprint input. The readout circuit 40 may be formed as an integrated circuit (IC) and attached to the second circuit board 32 in a chip on film (COF) method, but the configuration of the second circuit board 32 is not limited thereto, and may also be attached on the non-active region NAR of the display panel 10 by a chip on glass (COG) method, a chip on plastic (COP) method, or an ultrasonic bonding method.

The first circuit board 31 and the second circuit board 32 may be attached to one end of the display panel 10 using an anisotropic conductive film (ACF), respectively. Read lines of the first circuit board 31 and the second circuit board 32 may be electrically connected to a pad unit of the display panel 10. The first circuit board 31 and the second circuit board 32 may be a flexible film such as a flexible printed circuit board or a chip on film.

According to an exemplary embodiment, it is illustrated that the panel driving circuit 20 is disposed on one side in the second direction Y and the readout circuit 40 is disposed on the other side in the second direction Y, but the present disclosure is not limited thereto. For example, the panel driving circuit 20 and the readout circuit 40 may be an integrated driving circuit attached to one side in the second direction Y.

Hereinafter, the display cell 100 for mode test and the display device 1 after cutting according to another exemplary embodiment will be described with reference to FIGS. 14 to 17.

Figure 14:
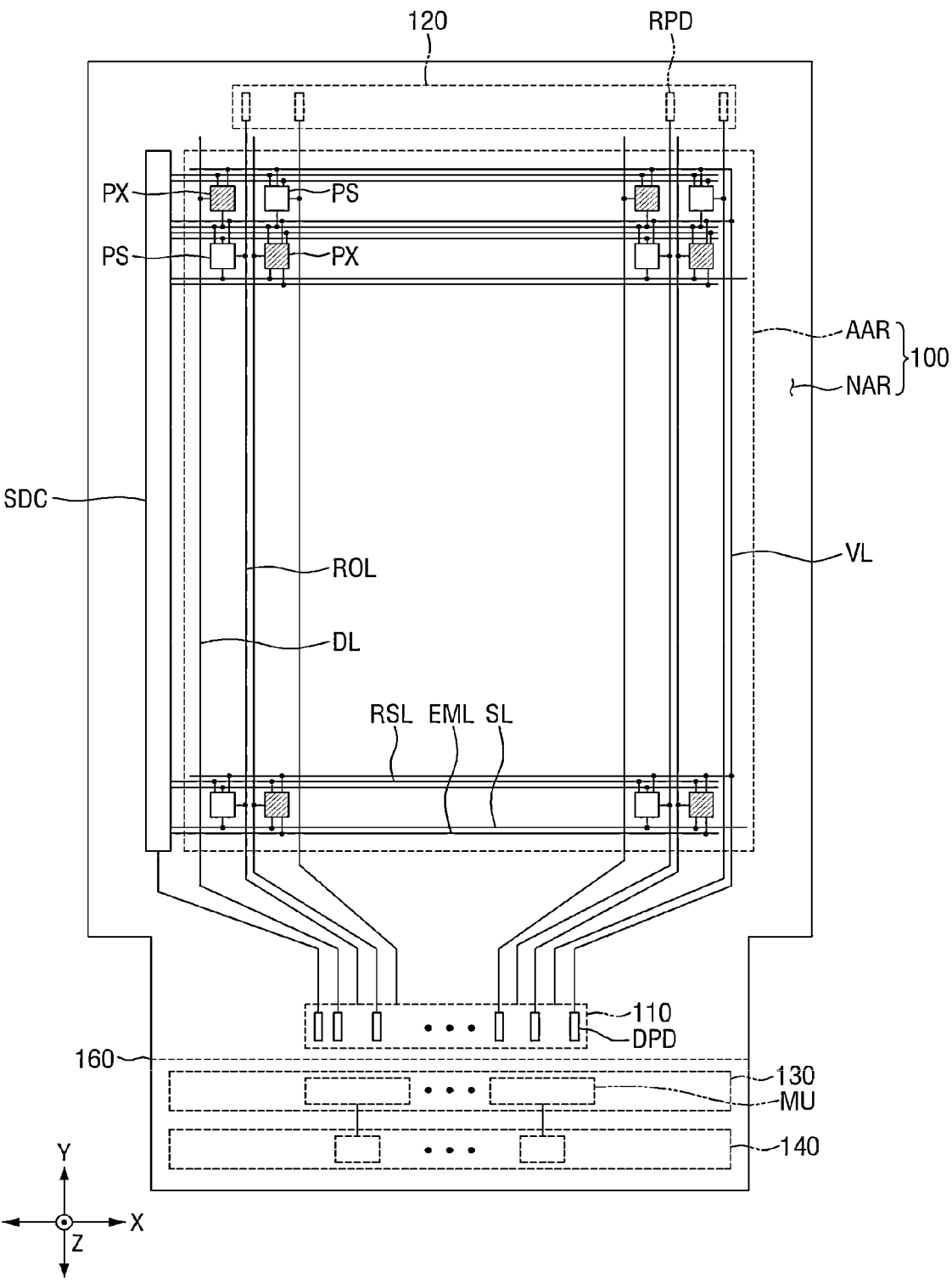
FIG. 14 is a schematic plan view of a display cell according to another exemplary embodiment.
Figure 15:
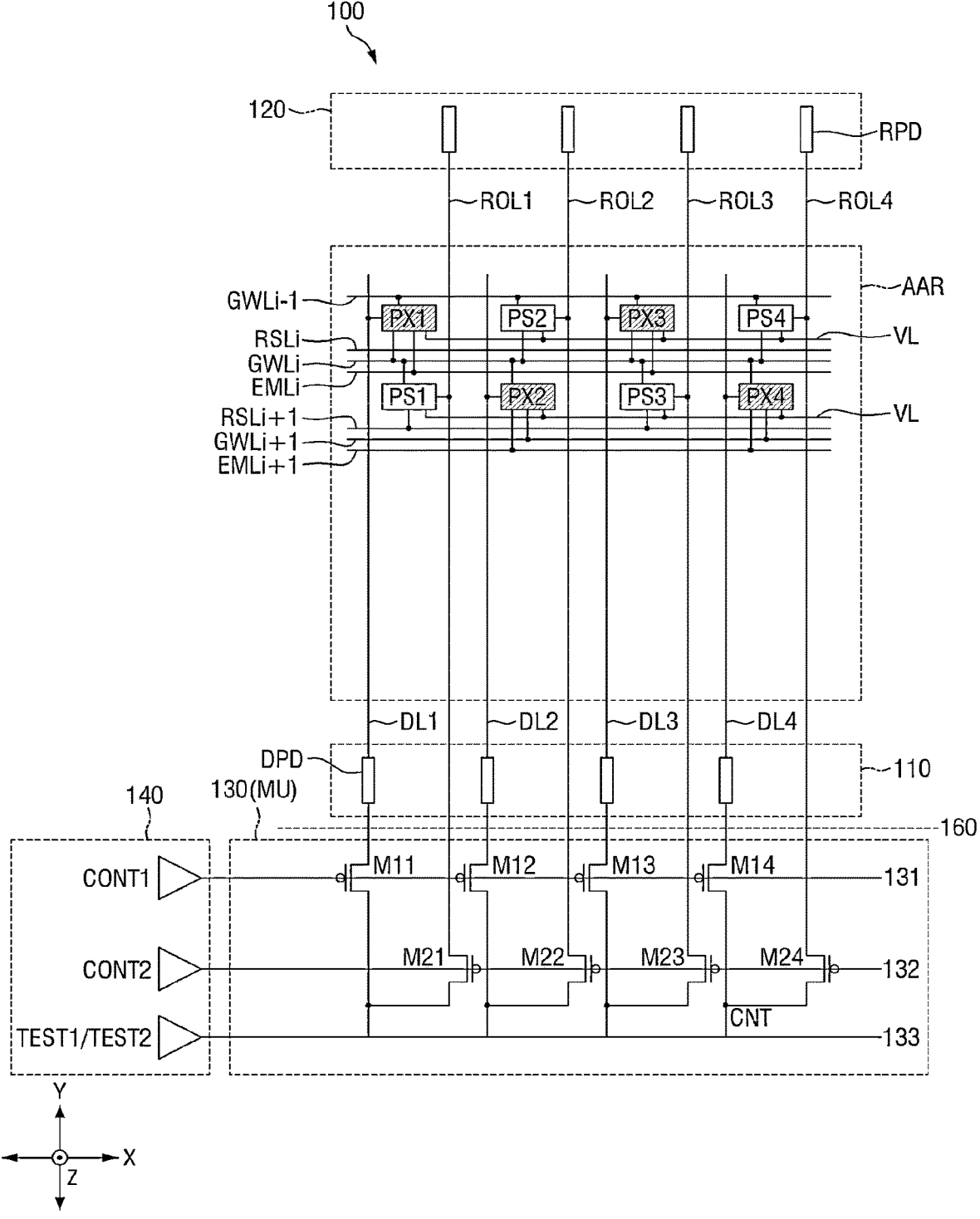
FIG. 15 is a conceptual view of the display cell according to FIG. 14.
Figure 16:
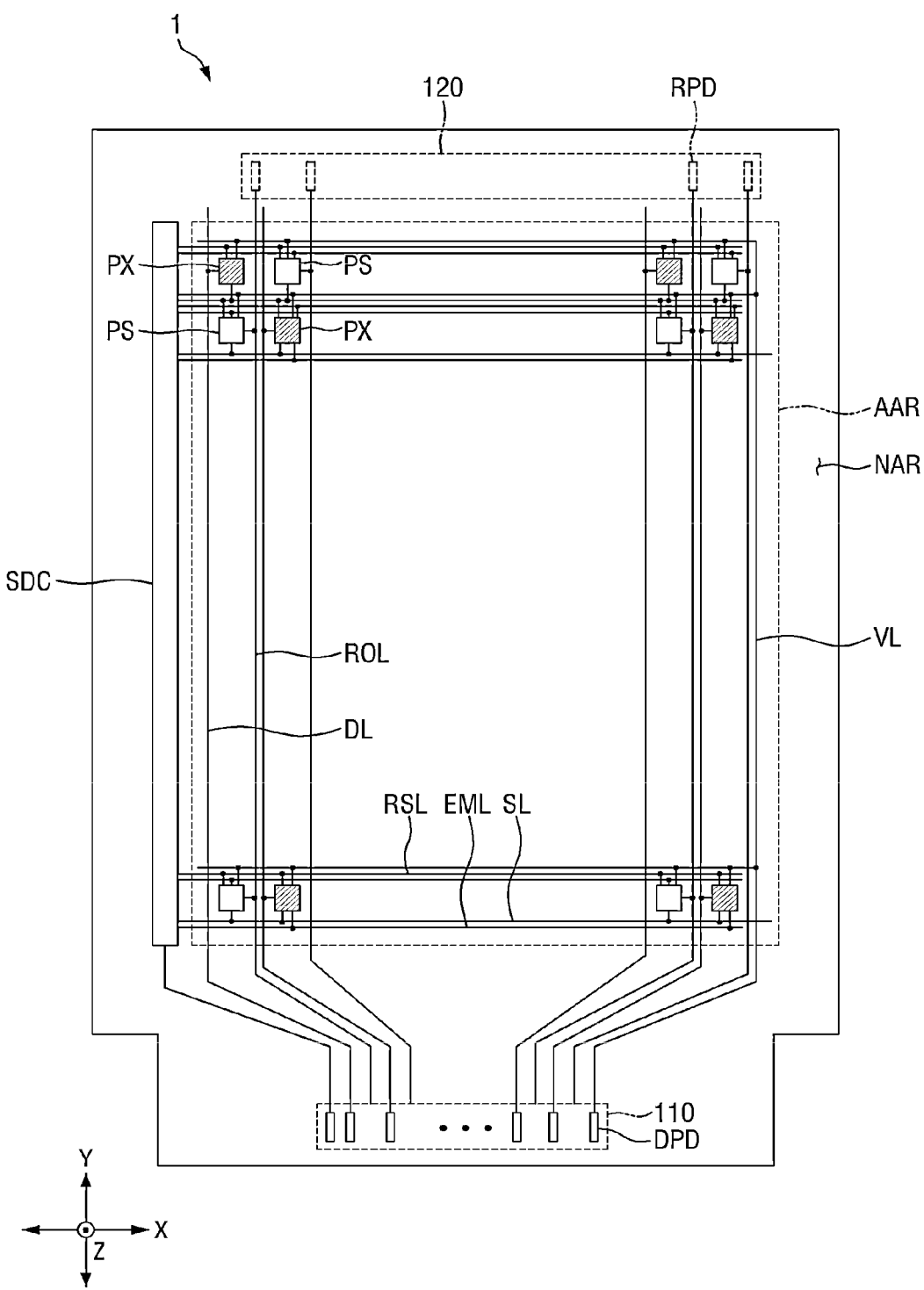
FIG. 16 is a schematic plan view of the display device after a cutting process of the display cell according to FIG. 14.
Figure 17:
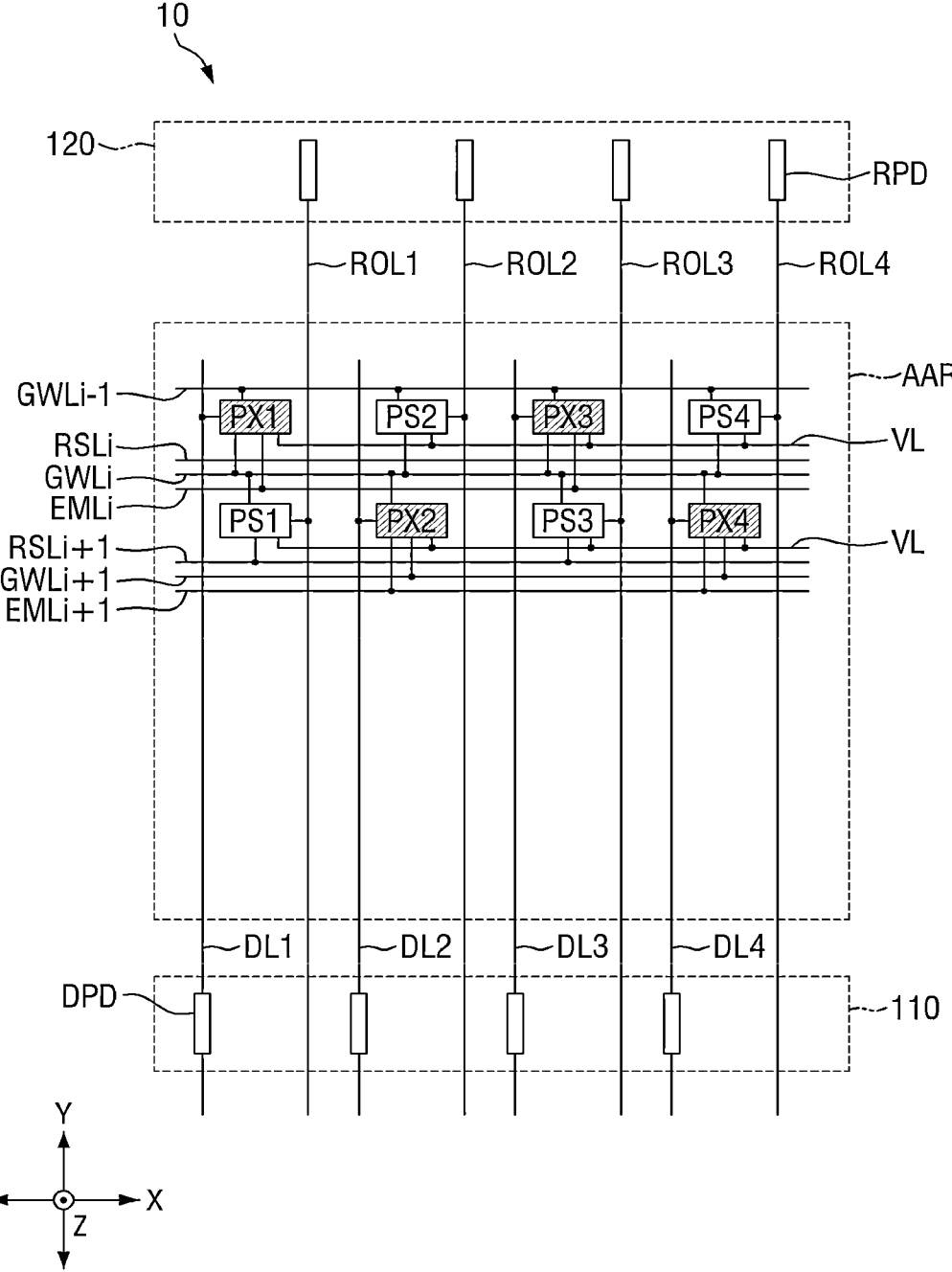
FIG. 17 is a conceptual view of the display device according to FIG. 16.

FIG. 14 is a schematic plan view of a display cell according to another exemplary embodiment. FIG. 15 is a conceptual view of the display cell according to FIG. 14. FIG. 16 is a schematic plan view of the display device after a cutting process of the display cell according to FIG. 14. FIG. 17 is a conceptual view of the display device according to FIG. 16.

The display device 1 according to the present exemplary embodiment is different from the display device according to the previous exemplary embodiment in that the cutting portion 160 cut through the cutting process before the module process is disposed between the first fan-out unit 110 and the signal selection unit 130. The cutting portion 160 may separate the first fan-out unit 110 from the signal selection unit 130 through the cutting process.

Specifically, the cutting portion 160 may be disposed between the data pads DPD of the first fan-out unit 110 and the second electrodes of the first switching transistors M11, M12, M13, and M14, and may be disposed between the sensing pads RPD of the second fan-out unit 120 and the second switching transistors M21, M22, M23, and M24. The second electrodes of the first switching transistors M11, M12, M13, and M14 and the data lines DL1, DL2, DL3, and DL4 may be separated by the cutting process. In addition, the second electrodes of the second switching transistors M21, M22, M23, and M24 and the readout lines ROL1, ROL2, ROL3, and ROL4 may be separated by the cutting process.

Referring to FIGS. 16 and 17, since the cutting portion 160 cuts a region disposed between the first fan-out unit 110 and the signal selection unit 130, the display device 1 may not include the signal selection unit 130. In this case, the data lines DL1, DL2, DL3, and DL4 and the readout lines ROL1, ROL2, ROL3, and ROL4 may be disposed on one side of the display device 1 in the second direction Y.

Figure 18:
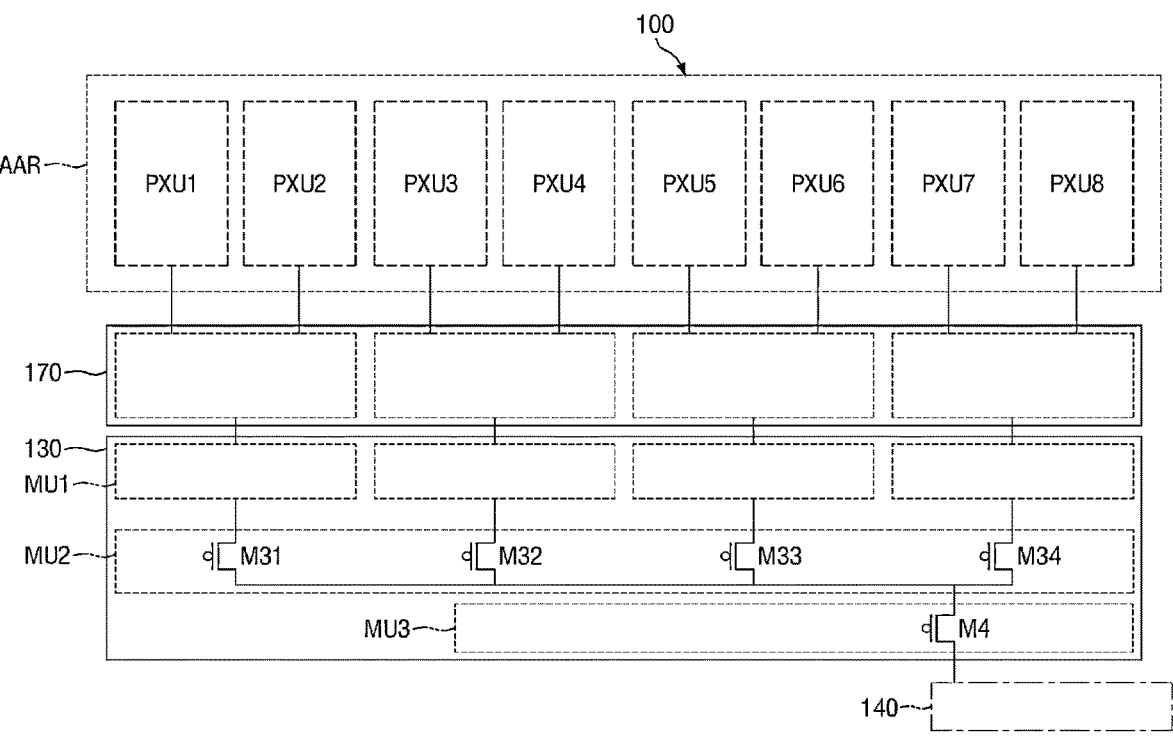
FIG. 18 is a schematic block diagram of a display cell according to still another exemplary embodiment.
Figure 19:
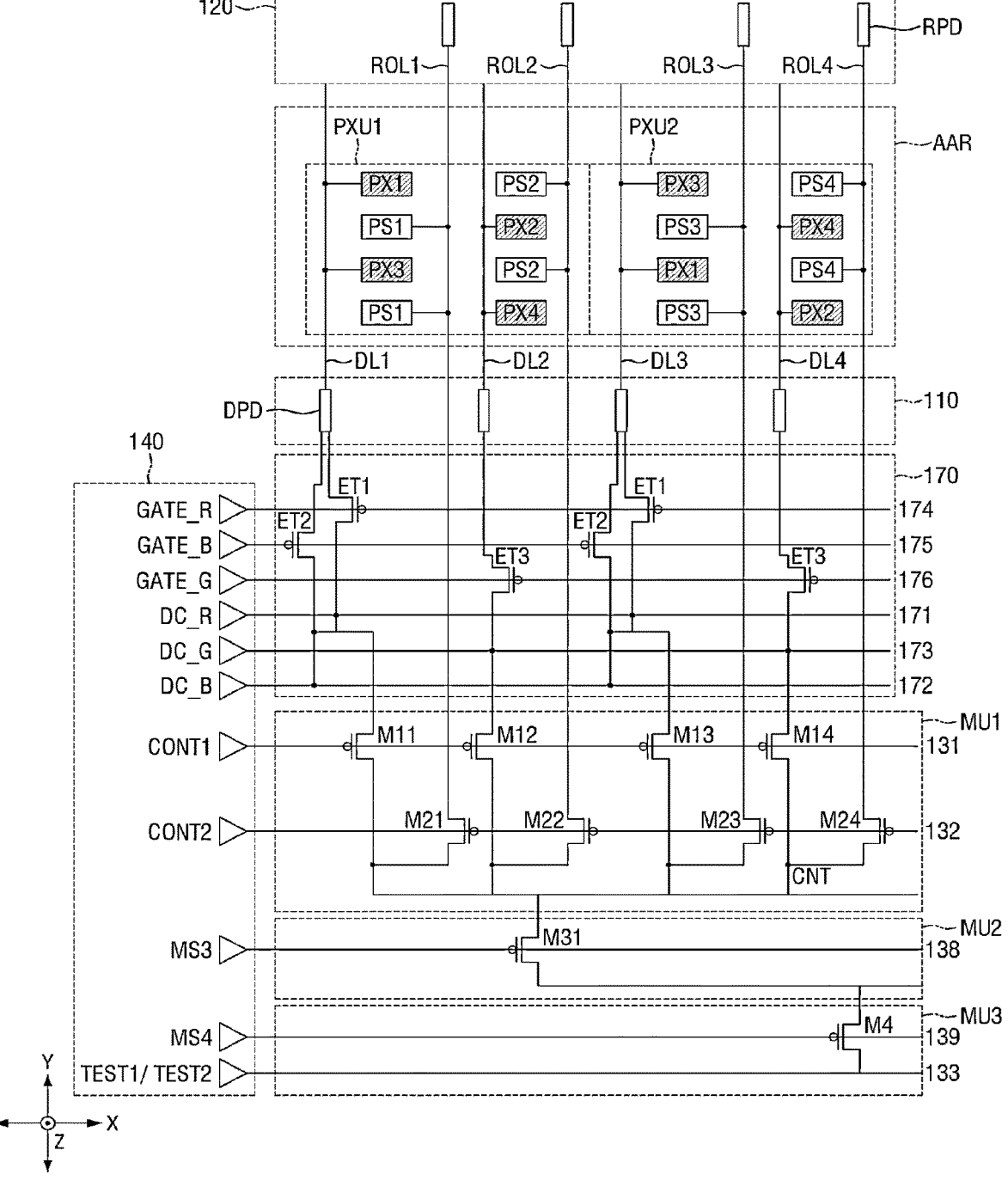
FIG. 19 is a detailed conceptual view of a first pixel unit and a second pixel unit according to FIG. 18.
Figure 20:
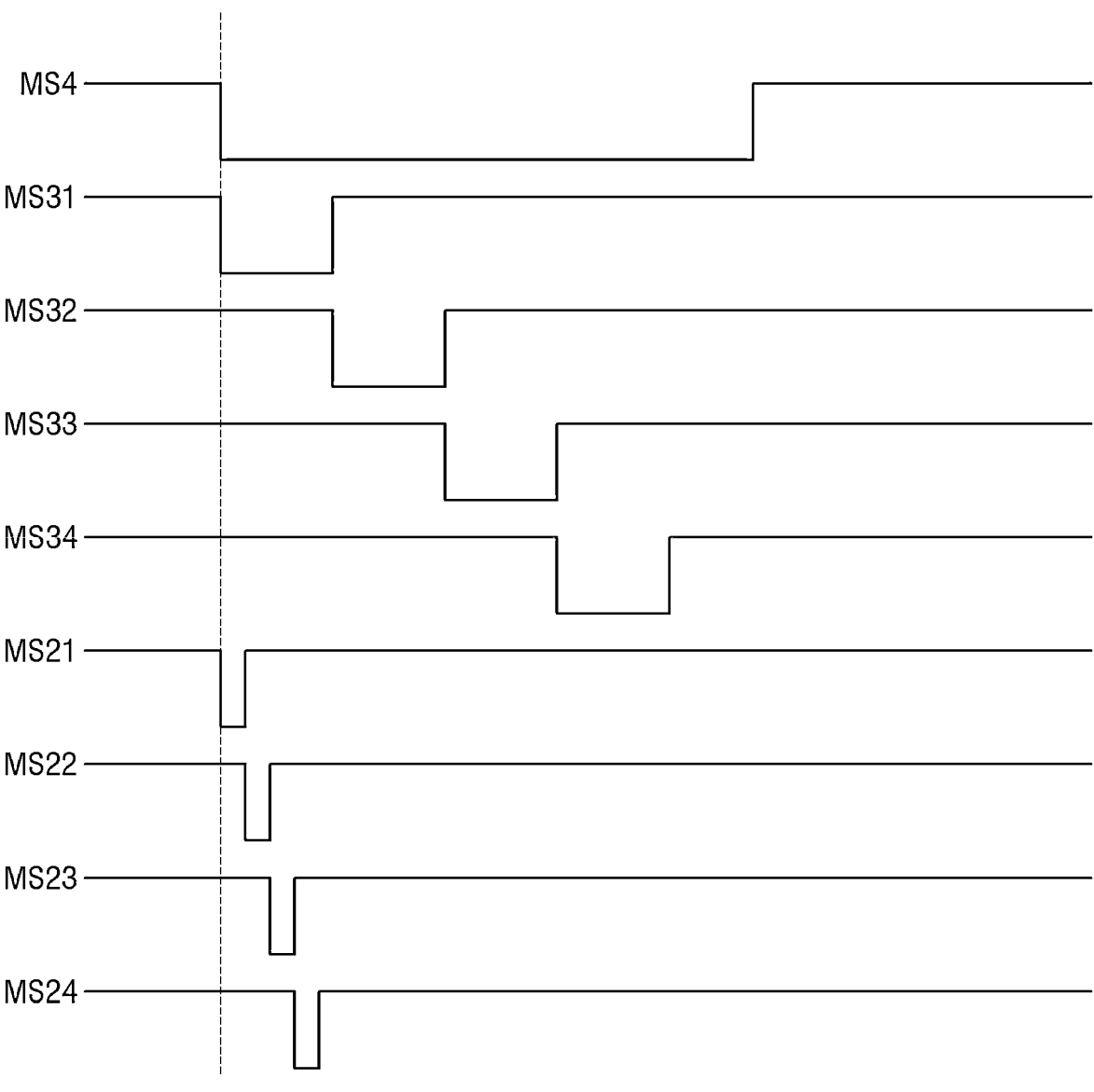
FIG. 20 is a waveform diagram of control signals according to FIG. 18.

Hereinafter, a display cell 100 according to still another exemplary embodiment will be described. FIG. 18 is a schematic block diagram of a display cell according to still another exemplary embodiment. FIG. 19 is a detailed conceptual view of a first pixel unit and a second pixel unit according to FIG. 18. FIG. 20 is a waveform diagram of control signals according to FIG. 18.

Referring to FIGS. 18 to 20, the display cell 100 may further include a lighting test unit 170 that tests lighting defects. In addition, the signal selection unit 130 may include a plurality of first multiplexers MU1, a plurality of second multiplexers MU2, and a plurality of third multiplexers MU3. The first multiplexer MU1 of the present exemplary embodiment corresponds to the multiplexer ('MU' in FIG. 5) of the previous exemplary embodiments.

The lighting test unit 170 may apply a data voltage of a full-white grayscale to each pixel unit PXU, and may test a lighting defect as to whether the pixel unit PXU emits full-white light. The lighting test unit 170 may be applied with lighting test signals provided from the test member ('200' in FIG. 1). The lighting test signals include lighting data signals DC_R, DC_B, DC_G of a specific grayscale for emitting light from a light emitting element, and lighting control signals GATE_R, GATE_B, and GATE_G for controlling the turn-on and turn-off of a plurality of lighting transistors ET1, ET2, and ET3 included in the lighting test unit 170. The lighting data signals DC_R, DC_B, and DC_G may be color data voltages of a white grayscale. The lighting test unit 170 provides the lighting data signals DC_R, DC_B, and DC_G to the plurality of data lines DL1, DL2, DL3, and DL4 in response to the lighting control signals GATE_R, GATE_B, and GATE_G.

The lighting test unit 170 includes a first lighting test line 171, a second lighting test line 172, a third lighting test line 173, a first lighting control line 174, a second lighting control line 175, a third lighting control line 176, and a plurality of lighting transistors ET1, ET2, and ET3.

The first lighting test line 171 transmits a first lighting data signal DC_R to odd-numbered data lines DL1 and DL3 among the plurality of data lines DL1, DL2, DL3, and DL4. The second lighting test line 172 transmits a second lighting data signal DC_B to the odd-numbered data lines DL1 and DL3 among the plurality of data lines DL1, DL2, DL3, and DL4. The third lighting test line 173 transmits a third lighting data signal DC_G to even-numbered data lines DL2 and DL4 among the plurality of data lines DL1, DL2, DL3, and DL4.

The first lighting control line 174 transmits a first lighting control signal GATE_R for controlling turn-on of the first lighting transistor ET1. The second lighting control line 175 transmits a second lighting control signal GATE_B for controlling turn-on of the second lighting transistor ET2. The third lighting control line 176 transmits a third lighting control signal GATE_G for controlling turn-on of the third lighting transistor ET3.

The first lighting transistor ET1 may be turned on according to the first lighting control signal GATE_R of the first lighting control line 174 to connect the first lighting test line 171 to the odd-numbered data lines DL1 and DL3. A gate electrode of the first lighting transistor ET1 is connected to the first lighting control line 174, a first electrode thereof is connected to the first lighting test line 171, and a second electrode thereof is connected to the odd-numbered data lines DL1 and DL3.

The second lighting transistor ET2 may be turned on according to the second lighting control signal GATE_B of the second lighting control line 175 to connect the second lighting test line 172 to the odd-numbered data lines DL1 and DL3. A gate electrode of the second lighting transistor ET2 is connected to the second lighting control line 175, a second electrode thereof is connected to the second lighting test line 172, and a first electrode thereof is connected to the odd-numbered data lines DL1 and DL3.

The third lighting transistor ET3 may be turned on according to the third lighting control signal GATE_G of the third lighting control line 176 to connect the third lighting test line 173 to the even-numbered data lines DL2 and DL4. A gate electrode of the third lighting transistor ET3 is connected to the third lighting control line 176, a first electrode thereof is connected to the third lighting test line 173, and a second electrode thereof is connected to the even-numbered data lines DL2 and DL4.

The test pad unit 140 receives the first lighting data signal DC_R, the second lighting data signal DC_B, and the third lighting data signal DC_G from the test member 200. The first lighting data signal DC_R may be a red data voltage of a white grayscale. The second lighting data signal DC_B may be a blue data voltage of a white grayscale. The third lighting data signal DC_G may be a green data voltage of a white grayscale. The lighting data signals DC_R, DC_B, and DC_G have an alternating current (AC) signal in which a gate high voltage and a gate low voltage are alternately repeated.

The red, blue, and green data voltages of white grayscale may be applied to the first to third lighting test lines 171, 172, and 173 during the lighting test mode, respectively. Accordingly, it is possible to check whether or not the active region AAR of the display cell 100 displays a white image to test a lighting defect.

Referring to FIGS. 18 and 19, the lighting test unit 170 may be connected to the first multiplexers MU1 of the signal selection unit 130. In addition, the first multiplexer MU1 may be connected to the second multiplexer MU2, and the second multiplexer MU2 may be connected to the third multiplexer MU3. The third multiplexer MU3 may be connected to the test pad unit 140.

One first multiplexer MU1 includes a plurality of first switching transistors M11, M12, M13, and M14 and a plurality of second switching transistors M21, M22, M23, and M24. The first switching transistors M11, M12, M13, and M14 may be turned on in response to the first test control signal CONT1 of the first test control line 131 to connect the data lines DL1, DL2, DL3, and DL4 to a first electrode of the third switching transistor M31 of the second multiplexer MU2. The second switching transistors M21, M22, M23, and M24 may be turned on in response to the second test control signal CONT2 to connect the readout lines ROL1, ROL2, ROL3, and ROL4 to the first electrode of the third switching transistor M31 of the second multiplexer MU2. For example, one first multiplexer MU1 may connect four data lines DL1, DL2, DL3, and DL4 and four readout lines ROL1, ROL2, ROL3, and ROL4 through one signal line. In other words, one first multiplexer MU1 may connect two pixel units PXU, for example, a first pixel unit PXU1 and a second pixel unit PXU2 through one signal line.

One second multiplexer MU2 includes a plurality of third switching transistors M31, M32, M33, and M34. The third switching transistors M31, M32, M33, and M34 may be turned on by a third switching signal MS3 of a third test control line 138 to connect the data lines DL1, DL2, DL3, and DL4 or the readout lines ROL1, ROL2, ROL3, and ROL4 to the first electrode of the fourth switching transistor M4 of the third multiplexer MU3. That is, one second multiplexer MU2 may connect 16 data lines and 16 readout lines through one signal line. In other words, one second multiplexer MU2 may connect 8 pixel units PXU, for example, a first pixel unit PXU1, a second pixel unit PXU2, a third pixel unit PXU3, a fourth pixel unit PXU4, a fifth pixel unit PXU5, a sixth pixel unit PXU6, a seventh pixel unit PXU7, and an eighth pixel unit PXU8 through one signal line.

One third multiplexer MU3 includes a plurality of fourth switching transistors M4. The fourth switching transistor M4 may be turned on by a fourth switching signal MS4 of a fourth test line 139 to connect the data line DL or the readout line ROL to the test signal line 133. Although not illustrated, the fourth switching transistor M4 may connect 16 pixel units PXU adjacent to each other through one test signal line 133.

However, the present disclosure is not limited thereto, and one first multiplexer MU1 may include n first switching transistors and n second switching transistors, the second multiplexer MU2 may include m third switching transistors, and the third multiplexer MU3 may include l fourth switching transistors (n, m, and l are positive integers).

The fourth test line 139 may be applied with the test data signal TEST1 or receive the test sensing signal TEST2 during the test mode. In this case, the 16 pixel units PXU may be applied with the test data signal TEST1 that are the same as each other or transmit the test detection signal TEST2. Accordingly, it is possible to easily test whether or not the plurality of pixels PX and the optical sensor PS are defective.

Referring to FIG. 20, while the fourth switching transistor M4 is turned on by the fourth switching signal MS4, the third switching transistors M31, M32, M33, and M34 may be sequentially turned on. While the third switching transistors M31, M32, M33, and M34 are respectively turned on, the second switching transistors M21, M22, M23, and M24 may be sequentially turned on. That is, while the fourth switching signal MS4 has the gate low voltage, the plurality of third switching signals MS31, MS32, MS33, and MS34 may sequentially have the gate low voltage. While one third switching signal MS31 has the gate low voltage, the plurality of second switching signals MS21, MS22, MS23, and MS24 may sequentially have the gate low voltage.

That is, even if each of the optical sensors PS is applied with the same signal at the same timing, it may be individually determined whether or not the first to fourth optical sensors PS1, PS2, PS3, and PS4 normally operate because the readout lines ROL are sequentially connected to the test signal line 133.

Meanwhile, the first switching signal (or the first test control signal CONT1) for turning on the first switching transistors M11, M12, M13, and M14 may have a gate high voltage and a gate low voltage independently of the second switching signals MS21, MS22, MS23, and MS24 as illustrated in FIG. 8. When the first switching transistors M11, M12, M13, and M14 are turned on according to the lighting test mode, it may be checked whether or not the plurality of lighting transistors ET1, ET2, and ET3 are respectively turned on to display a white image.

In other words, the test system may individually determine whether or not the plurality of pixels PX and optical sensors PS normally operate.

In concluding the detailed description, those skilled in the art will appreciate that many variations and modifications can be made to the preferred embodiments without substantially departing from the principles of the inventive concept. Therefore, the disclosed preferred embodiments of the inventive concept are used in a generic and descriptive sense only and not for purposes of limitation.

What is claimed is:

1. A test system comprising:
   a display cell including a pixel and a data line connected to the pixel, an optical sensor and a readout line separated from the data line and connected to the optical sensor, and a signal selection unit for selectively connecting a test signal line to any one of the data line and the readout line; and
   a test member configured to apply a first test control signal to the signal selection unit in a data test mode and apply a second test control signal to the signal selection unit in a sensing test mode, wherein the test member includes a test signal receiving unit configured to receive a test sensing signal from the optical sensor in the sensing test mode,
   wherein the signal selection unit includes:
   a first switching transistor configured to be turned on in response to the first test control signal to connect the test signal line to the data line, the first switching transistor comprising a source electrode and a drain electrode neither of which is connected to the readout line; and
   a second switching transistor configured to be turned on in response to the second test control signal to connect the test signal line to the readout line, the second switching transistor comprising a source electrode and a drain electrode neither of which is connected to the data line
   a test signal reading unit configured to read the test sensing signal received from the test signal receiving unit and determine whether or not the optical sensor normally operates.

2. The test system of claim 1, wherein the first switching transistor and the second switching transistor are not turned on at the same time.

3. The test system of claim 1, wherein the signal selection unit includes:
   a first test control line configured to transmit the first test control signal to the first switching transistor, and a second test control line configured to transmit the second test control signal to the second switching transistor.

4. The test system of claim 1, wherein the test member includes a test signal output unit for applying a test data signal to the pixel in the data test mode, and the test data signal is a direct current (DC) data voltage.

5. The test system of claim 4, further comprising:

a test pad unit disposed on one side of the signal selection unit and configured to receive the first test control signal, the second test control signal, the test data signal, and the test sensing signal; and a cutting portion disposed between the signal selection unit and the test pad unit.

6. The test system of claim 5, further comprising a first fan-out unit disposed between the signal selection unit and the pixel, and including data pads connected to the data line, wherein the cutting portion is disposed between the first fan-out unit and the signal selection unit.

7. The test system of claim 1, wherein the pixel includes a first pixel and a second pixel disposed adjacent to the first pixel, wherein the data line includes a first data line connected to the first pixel and a second data line connected to the second pixel, the first data line and the second data line being electrically connected to the test signal line of the signal selection unit, wherein the optical sensor includes a first optical sensor and a second optical sensor disposed adjacent to the first optical sensor, wherein the readout line includes a first readout line connected to the first optical sensor and a second readout line connected to the second optical sensor, the first readout line and the second readout line being electrically connected to the test signal line of the signal selection unit, wherein the second switching transistor of the signal selection unit includes a first sub-transistor connected to the first data line and a second sub-transistor connected to the second data line, and wherein the first sub-transistor and the second sub-transistor are sequentially turned on.

8. The test system of claim 7, wherein the first switching transistor of the signal selection unit includes a third sub-transistor connected to the first readout line and a fourth sub-transistor connected to the second readout line, and wherein the third sub-transistor and the fourth sub-transistor are simultaneously turned on.

9. A method of testing a display cell, the method comprising:

outputting, by a test member, a first test control signal in a data test mode;

outputting, by the test member, a second test control signal in a sensing test mode;

outputting, by an optical sensor, a test sensing signal to a readout line connected to the optical sensor, the test sensing signal being generated according to external light;

connecting a test signal line of a signal selection unit to the readout line in response to the second test control signal; and connecting a data line connected to a pixel to the test signal line in response to the first test control signal, wherein a first switching transistor is configured to be turned on in response to the first test control signal to connect the test signal line to the data line, the first switching transistor comprises a source electrode and a drain electrode neither of which is connected to the readout line, a second switching transistor is configured to be turned on in response to the second test control signal to connect the test signal line to the readout line, and the second switching transistor comprises a source electrode and a drain electrode neither of which is connected to the data line, and wherein the readout line is separated from the data line;

receiving, by the test member, the test sensing signal from the optical sensor in the sensing test mode and test whether or not the optical sensor normally operates.

10. The method of claim 9, wherein the signal selection unit includes a first switching transistor and a second switching transistor, wherein the connecting of the data line connected to the pixel to the test signal line in response to the first test control signal includes turning on the first switching transistor, and wherein the connecting of the test signal line of the signal selection unit to the readout line in response to the second test control signal includes turning on the second switching transistor.

11. The method of claim 10, further comprising:

applying, by the test member, a test data signal that is a DC data voltage to the pixel in the data test mode.

12. A display device comprising:

a substrate;

a pixel and an optical sensor disposed on the substrate;

a data line connected to the pixel;

a readout line connected to the optical sensor;

a first floating line and a second floating line exposed through one side surface of the substrate;

a first switching transistor connected between the first floating line and the data line; and a second switching transistor connected between the second floating line and the readout line.

13. The display device of claim 12, further comprising a third floating line and a fourth floating line exposed through another side surface of the substrate disposed adjacent to the one side surface of the substrate, wherein the third floating line is connected to a gate electrode of the first switching transistor and the fourth floating line is connected to a gate electrode of the second switching transistor.

14. The display device of claim 13, wherein the first floating line, the second floating line, the third floating line, and the fourth floating line are electrically floated.

15. The display device of claim 13, wherein the third floating line and the fourth floating line are connected to a gate high voltage line or a gate low voltage line.

16. The display device of claim 12, further comprising a first fan-out unit including a data pad connected to the data line, wherein a first electrode of the first switching transistor is connected to the first floating line and a second electrode of the first switching transistor is connected to the data pad.

17. The display device of claim 16, further comprising a second fan-out unit including a sensing pad connected to the readout line, wherein a first electrode of the second switching transistor is connected to the second floating line and a second electrode of the second switching transistor is connected to the sensing pad.

18. The display device of claim 12, wherein the optical sensor includes:

a photoelectric conversion element for generating a photocurrent according to external light; and a first sensing transistor for controlling a sensing current flowing through the readout line according to the photocurrent.

19. The display device of claim 18, wherein the pixel includes:

a light emitting element that emits light according to a data voltage, and a common voltage line electrically connecting a cathode electrode of the light emitting element and a sensing cathode electrode of the photoelectric conversion element to each other.

\* \* \* \* \*